(12) United States Patent
Sun et al.

(10) Patent No.: US 11,053,581 B2
(45) Date of Patent: *Jul. 6, 2021

(54) PLASMA EROSION RESISTANT RARE-EARTH OXIDE BASED THIN FILM COATINGS

(71) Applicant: Applied Materials, Inc., Santa Clara, CA (US)

(72) Inventors: Jennifer Y. Sun, Mountain View, CA (US); Biraja P. Kanungo, San Jose, CA (US); Vahid Firouzdor, San Mateo, CA (US); Tom Cho, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,341

(22) Filed: Nov. 15, 2019

(65) Prior Publication Data

US 2020/0087776 A1 Mar. 19, 2020

Related U.S. Application Data

(60) Continuation of application No. 15/814,601, filed on Nov. 16, 2017, now Pat. No. 10,501,843, which is a
(Continued)

(51) Int. Cl.
*B32B 18/00* (2006.01)
*C23C 14/08* (2006.01)
(Continued)

(52) U.S. Cl.
CPC .............. *C23C 14/08* (2013.01); *B32B 18/00* (2013.01); *C23C 14/083* (2013.01); *C23C 14/22* (2013.01);
(Continued)

(58) Field of Classification Search
CPC ......... B32B 18/00; C04B 35/00; C04B 35/01; C04B 35/10; C04B 35/117; C04B 35/44; C04B 35/48; C04B 35/50; C04B 35/505
(Continued)

(56) References Cited

U.S. PATENT DOCUMENTS 3,796,182 A 3/1974 Rosler
4,399,199 A 8/1983 McGill et al.
(Continued)

FOREIGN PATENT DOCUMENTS

CN 102210196 10/2011
DE 10224137 12/2003
(Continued)

OTHER PUBLICATIONS

English Translation for Office Action issued for JP2016-521573 dated Mar. 20, 2018, 7 pages.
(Continued)

*Primary Examiner* — Maria V Ewald
*Assistant Examiner* — Ethan A. Utt
(74) *Attorney, Agent, or Firm* — Lowenstein Sandler LLP

(57) ABSTRACT

An article comprises a body and at least one protective layer on at least one surface of the body. The at least one protective layer is a thin film having a thickness of less than approximately 20 microns that comprises a ceramic selected from a group consisting of $Y_3Al_5O_{12}$, $Er_2O_3$, $Er_3Al_5O_{12}$, and a ceramic compound comprising $Y_4Al_2O_9$ and a solid-solution of $Y_2O_3$—$ZrO_2$.

20 Claims, 7 Drawing Sheets

Related U.S. Application Data division of application No. 14/306,583, filed on Jun. 17, 2014, now Pat. No. 9,850,568.

(60) Provisional application No. 61/837,595, filed on Jun. 20, 2013.

(51) Int. Cl.

| | | |
|---|---|---|
| *C23C 14/22* | (2006.01) | |
| *H01J 37/32* | (2006.01) | |
| *C23C 14/34* | (2006.01) | |

(52) U.S. Cl.
CPC .......... *C23C 14/228* (2013.01); *C23C 14/34* (2013.01); *H01J 37/32477* (2013.01); *H01J 37/32495* (2013.01); *Y10T 428/24355* (2015.01); *Y10T 428/24967* (2015.01); *Y10T 428/24975* (2015.01); *Y10T 428/265* (2015.01)

(58) Field of Classification Search
USPC ......... 428/688, 689, 697, 699–702; 501/134, 501/152, 153
See application file for complete search history.

(56) References Cited

U.S. PATENT DOCUMENTS

| | | | |
|---|---|---|---|
| 4,439,248 A | 3/1984 | Herchenroeder et al. | |
| 4,642,440 A | 2/1987 | Schnackel et al. | |
| 4,695,439 A | 9/1987 | Ritsko et al. | |
| 4,704,299 A | 11/1987 | Wielonski et al. | |
| 4,773,928 A | 9/1988 | Houck et al. | |
| 4,880,614 A | 11/1989 | Strangman et al. | |
| 5,381,944 A | 1/1995 | Makowiecki et al. | |
| 5,415,756 A | 5/1995 | Wolfe et al. | |
| 5,626,923 A | 5/1997 | Fitzgibbons et al. | |
| 5,631,803 A | 5/1997 | Cameron et al. | |
| 5,687,679 A | 11/1997 | Mullin et al. | |
| 5,766,693 A | 6/1998 | Rao | |
| 5,800,871 A | 9/1998 | Collins et al. | |
| 5,837,058 A | 11/1998 | Chen et al. | |
| 5,853,815 A | 12/1998 | Muehlberger | |
| 5,916,689 A | 6/1999 | Collins et al. | |
| 6,106,959 A | 8/2000 | Vance et al. | |
| 6,194,083 B1 | 2/2001 | Yasuda et al. | |
| 6,245,202 B1 | 6/2001 | Edamura et al. | |
| 6,326,076 B1 | 12/2001 | Takai | |
| 6,361,645 B1 | 3/2002 | Schoepp et al. | |
| 6,506,254 B1 | 1/2003 | Bosch et al. | |
| 6,530,990 B2 | 3/2003 | Kong et al. | |
| 6,534,194 B2 | 3/2003 | Weihs et al. | |
| 6,548,424 B2 | 4/2003 | Putkonen | |
| 6,576,354 B2 | 6/2003 | Tsukatani et al. | |
| 6,581,275 B2 | 6/2003 | Narendrnath et al. | |
| 6,616,031 B2 | 9/2003 | Wong et al. | |
| 6,620,520 B2 | 9/2003 | ODonnell et al. | |
| 6,733,843 B2 | 5/2004 | Tsukatani et al. | |
| 6,777,353 B2 | 8/2004 | Putkonen | |
| 6,783,875 B2 | 8/2004 | Yamada et al. | |
| 6,794,047 B2 | 9/2004 | Takai et al. | |
| 6,794,059 B2 | 9/2004 | Shanker | |
| 6,798,519 B2 | 9/2004 | Nishimoto et al. | |
| 6,805,952 B2 | 10/2004 | Chang et al. | |
| 6,858,332 B2 | 2/2005 | Yamada | |
| 6,858,546 B2 | 2/2005 | Niinist et al. | |
| 6,884,514 B2 | 4/2005 | Simpson et al. | |
| 6,916,534 B2 | 7/2005 | Wataya et al. | |
| 6,933,254 B2 | 8/2005 | Morita et al. | |
| 6,942,929 B2 | 9/2005 | Han et al. | |
| 6,949,203 B2 | 9/2005 | Hsieh et al. | |
| 6,962,524 B2 | 11/2005 | Butterfield et al. | |
| 7,278,911 B2 | 10/2007 | Butterfield et al. | |
| 7,300,537 B2 | 11/2007 | ODonnell et al. | |
| 7,351,482 B2 | 4/2008 | Boutwell et al. | |
| 7,351,658 B2 | 4/2008 | Putkonen | |
| 7,384,696 B2 | 6/2008 | Hayasaki et al. | |
| 7,422,516 B2 | 9/2008 | Butterfield et al. | |
| 7,441,688 B2 | 10/2008 | Van Heerden et al. | |
| 7,479,464 B2 | 1/2009 | Sun et al. | |
| 7,498,272 B2 | 3/2009 | Niinisto et al. | |
| 7,507,268 B2 | 3/2009 | Rosenflanz | |
| 7,510,641 B2 | 3/2009 | Kreiskott et al. | |
| 7,615,133 B2 | 11/2009 | Tateno et al. | |
| 7,648,782 B2 | 1/2010 | Kobayashi et al. | |
| 7,649,729 B2 | 1/2010 | Buchberger, Jr. et al. | |
| 7,655,328 B2 | 2/2010 | Maeda et al. | |
| 7,672,110 B2 | 3/2010 | Sun et al. | |
| 7,690,308 B2 | 4/2010 | Nielson et al. | |
| 7,696,117 B2 | 4/2010 | Sun et al. | |
| 7,767,268 B2 | 8/2010 | Harada et al. | |
| 7,790,216 B2 | 9/2010 | Popoola et al. | |
| 7,810,704 B2 | 10/2010 | Duckham et al. | |
| 7,838,083 B1 | 11/2010 | Youchison et al. | |
| 7,846,291 B2 | 12/2010 | Otsuki | |
| 7,964,517 B2 | 6/2011 | Jaiswal | |
| 7,968,205 B2 | 6/2011 | Nakano et al. | |
| 8,034,734 B2 | 10/2011 | Sun et al. | |
| 8,129,029 B2 | 3/2012 | Sun et al. | |
| 8,206,829 B2 | 6/2012 | Sun et al. | |
| 8,367,227 B2 | 2/2013 | Sun et al. | |
| 8,404,572 B2 | 3/2013 | Chang et al. | |
| 8,619,406 B2 | 12/2013 | Cho et al. | |
| 8,758,858 B2 | 6/2014 | Sun et al. | |
| 8,858,745 B2 | 10/2014 | Sun et al. | |
| 8,941,969 B2 | 1/2015 | Thach et al. | |
| 9,017,765 B2 | 4/2015 | Sun et al. | |
| 9,034,199 B2 | 5/2015 | Duan et al. | |
| 9,090,046 B2 | 7/2015 | Sun et al. | |
| 9,142,439 B2 | 9/2015 | Jindo et al. | |
| 9,212,099 B2 | 12/2015 | Sun et al. | |
| 9,394,615 B2 | 7/2016 | Sun et al. | |
| 9,440,886 B2 | 9/2016 | Sun et al. | |
| 9,583,369 B2 | 2/2017 | Sun et al. | |
| 9,617,188 B2 | 4/2017 | Sun et al. | |
| 9,711,334 B2 | 7/2017 | Sun et al. | |
| 9,725,799 B2 | 8/2017 | Sun et al. | |
| 9,850,568 B2 | 12/2017 | Sun et al. | |
| 9,976,211 B2 | 5/2018 | Firouzdor et al. | |
| 10,119,188 B2 * | 11/2018 | Sun | B32B 18/00 |
| 2001/0003271 A1 | 6/2001 | Otsuki | |
| 2002/0018921 A1 | 2/2002 | Yamada et al. | |
| 2002/0043666 A1 | 4/2002 | Parsons et al. | |
| 2002/0086119 A1 | 7/2002 | Hariharan et al. | |
| 2002/0100424 A1 | 8/2002 | Sun et al. | |
| 2003/0007308 A1 | 1/2003 | Harada et al. | |
| 2003/0024807 A1 | 2/2003 | Baldwin et al. | |
| 2003/0029563 A1 | 2/2003 | Kaushal et al. | |
| 2003/0047464 A1 | 3/2003 | Sun et al. | |
| 2003/0047802 A1 | 3/2003 | Hiramatsu et al. | |
| 2003/0051811 A1 | 3/2003 | Uchimaru et al. | |
| 2003/0134134 A1 | 7/2003 | Simpson et al. | |
| 2003/0159657 A1 | 8/2003 | Kaushal et al. | |
| 2003/0164354 A1 | 9/2003 | Hsieh et al. | |
| 2003/0175142 A1 | 9/2003 | Milonopoulou et al. | |
| 2003/0185965 A1 | 10/2003 | Lin et al. | |
| 2003/0186034 A1 | 10/2003 | Yamada | |
| 2003/0232139 A1 | 12/2003 | DeTura | |
| 2003/0232221 A1 | 12/2003 | Yamada et al. | |
| 2004/0009297 A1 | 1/2004 | Fusaro, Jr. et al. | |
| 2004/0033385 A1 | 2/2004 | Kaushal et al. | |
| 2004/0110016 A1 | 6/2004 | Hamaya et al. | |
| 2004/0157473 A1 | 8/2004 | Hayashi et al. | |
| 2004/0191545 A1 | 9/2004 | Han et al. | |
| 2004/0216667 A1 | 11/2004 | Mitsuhashi et al. | |
| 2004/0229078 A1 | 11/2004 | Maeda | |
| 2004/0266216 A1 | 12/2004 | Li et al. | |
| 2005/0037193 A1 | 2/2005 | Sun et al. | |
| 2005/0042876 A1 | 2/2005 | Kobayashi et al. | |
| 2005/0056056 A1 | 3/2005 | Wong | |
| 2005/0084654 A1 | 4/2005 | Takahashi et al. | |
| 2005/0136188 A1 | 6/2005 | Chang | |
| 2005/0153069 A1 | 7/2005 | Tapphorn et al. | |
| 2005/0164513 A1 | 7/2005 | DeOrnellas et al. | |
| 2005/0181566 A1 | 8/2005 | Machida et al. | |

(56) References Cited

U.S. PATENT DOCUMENTS

| | | |
|---|---|---|
| 2005/0227118 A1 | 10/2005 | Uchimaru et al. |
| 2005/0266682 A1 | 12/2005 | Chen et al. |
| 2005/0284770 A1 | 12/2005 | Butterfield et al. |
| 2006/0051602 A1 | 3/2006 | Iacovangelo et al. |
| 2006/0068189 A1 | 3/2006 | Raybould et al. |
| 2006/0081939 A1 | 4/2006 | Akasaka et al. |
| 2006/0090704 A1 | 5/2006 | Ide et al. |
| 2006/0096703 A1 | 5/2006 | Moriya et al. |
| 2006/0096704 A1 | 5/2006 | Kim |
| 2006/0164785 A1 | 7/2006 | Pellegrin |
| 2006/0222777 A1 | 10/2006 | Skoog et al. |
| 2006/0233944 A1 | 10/2006 | Popoola et al. |
| 2007/0006561 A1 | 1/2007 | Brady et al. |
| 2007/0047170 A1 | 3/2007 | Sun et al. |
| 2007/0110915 A1 | 5/2007 | Kitamura et al. |
| 2007/0111030 A1 | 5/2007 | Nakano et al. |
| 2007/0113783 A1 | 5/2007 | Lee et al. |
| 2007/0169891 A1 | 7/2007 | Koshiishi et al. |
| 2007/0212567 A1 | 9/2007 | Esaki et al. |
| 2007/0218302 A1 | 9/2007 | Kobayashi et al. |
| 2007/0274837 A1 | 11/2007 | Taylor et al. |
| 2008/0009417 A1 | 1/2008 | Lou et al. |
| 2008/0016684 A1 | 1/2008 | Olechnowicz et al. |
| 2008/0029032 A1 | 2/2008 | Sun et al. |
| 2008/0057326 A1 | 3/2008 | Schlichting et al. |
| 2008/0090034 A1 | 4/2008 | Harrison et al. |
| 2008/0099148 A1 | 5/2008 | Ryabova et al. |
| 2008/0108225 A1 | 5/2008 | Sun et al. |
| 2008/0113218 A1 | 5/2008 | Schlichting et al. |
| 2008/0142755 A1 | 6/2008 | Vaidhyanathan et al. |
| 2008/0169588 A1 | 7/2008 | Shih et al. |
| 2008/0174930 A1 | 7/2008 | Hattori et al. |
| 2008/0176149 A1 | 7/2008 | Grimbergen |
| 2008/0213496 A1 | 9/2008 | Sun et al. |
| 2008/0223574 A1 | 9/2008 | Dickson et al. |
| 2008/0223725 A1 | 9/2008 | Han et al. |
| 2008/0237029 A1 | 10/2008 | Tang et al. |
| 2008/0241412 A1 | 10/2008 | Inaki et al. |
| 2008/0261800 A1 | 10/2008 | Yuan et al. |
| 2008/0264564 A1 | 10/2008 | Sun et al. |
| 2008/0264565 A1 | 10/2008 | Sun et al. |
| 2008/0268171 A1 | 10/2008 | Ma et al. |
| 2008/0268645 A1 | 10/2008 | Kao et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0075486 A1 | 3/2009 | Kikuyama et al. |
| 2009/0133713 A1 | 5/2009 | Ohmi et al. |
| 2009/0142588 A1 | 6/2009 | Ohmi et al. |
| 2009/0162647 A1 | 6/2009 | Sun et al. |
| 2009/0214825 A1 | 8/2009 | Sun et al. |
| 2009/0252945 A1 | 10/2009 | Refke et al. |
| 2009/0284894 A1 | 11/2009 | Cooke |
| 2009/0297718 A1 | 12/2009 | Sarrafi-Nour et al. |
| 2010/0028572 A1 | 2/2010 | Kobayashi et al. |
| 2010/0039747 A1 | 2/2010 | Sansoni et al. |
| 2010/0048379 A1 | 2/2010 | Thippareddy et al. |
| 2010/0053841 A1 | 3/2010 | Rusinko, Jr. et al. |
| 2010/0112192 A1 | 5/2010 | Li et al. |
| 2010/0119843 A1 | 5/2010 | Sun et al. |
| 2010/0119844 A1 | 5/2010 | Sun et al. |
| 2010/0129670 A1 | 5/2010 | Sun et al. |
| 2010/0160143 A1 | 6/2010 | Sun et al. |
| 2010/0177454 A1 | 7/2010 | Elliot et al. |
| 2010/0218472 A1 | 9/2010 | Iyer |
| 2010/0272982 A1 | 10/2010 | Dickinson et al. |
| 2010/0314356 A1 | 12/2010 | Nagayama et al. |
| 2011/0049729 A1 | 3/2011 | Naundorf et al. |
| 2011/0086178 A1 | 4/2011 | Ruud et al. |
| 2011/0135915 A1 | 6/2011 | Lee et al. |
| 2011/0149462 A1 | 6/2011 | Kugimoto et al. |
| 2011/0151237 A1 | 6/2011 | Nakano et al. |
| 2011/0174441 A1 | 7/2011 | Yamashita et al. |
| 2011/0198034 A1 | 8/2011 | Sun et al. |
| 2011/0256411 A1 | 10/2011 | Courcot et al. |
| 2011/0268877 A1 | 11/2011 | Dickson et al. |
| 2011/0268956 A1 | 11/2011 | Fagoaga Altuna et al. |
| 2011/0315081 A1 | 12/2011 | Law et al. |
| 2012/0034469 A1 | 2/2012 | Sun et al. |
| 2012/0040100 A1 | 2/2012 | Matias et al. |
| 2012/0074514 A1 | 3/2012 | Nguyen et al. |
| 2012/0076574 A1 | 3/2012 | Parkhe |
| 2012/0100299 A1 | 4/2012 | Zajchowski et al. |
| 2012/0100300 A1 | 4/2012 | Gindrat et al. |
| 2012/0104703 A1 | 5/2012 | Sun et al. |
| 2012/0125488 A1 | 5/2012 | Sun et al. |
| 2012/0144640 A1 | 6/2012 | Shih et al. |
| 2012/0196139 A1 | 8/2012 | Petorak et al. |
| 2012/0299253 A1 | 11/2012 | Kosakai et al. |
| 2012/0307412 A1 | 12/2012 | Boyd, Jr. et al. |
| 2013/0019797 A1 | 1/2013 | Tanaka et al. |
| 2013/0023401 A1 | 1/2013 | Watanabe et al. |
| 2013/0026720 A1 | 1/2013 | Hori et al. |
| 2013/0048606 A1 | 2/2013 | Mao et al. |
| 2013/0115418 A1 | 5/2013 | Young-Dohe et al. |
| 2013/0130052 A1 | 5/2013 | Menuey et al. |
| 2013/0156958 A1 | 6/2013 | Belov et al. |
| 2013/0174983 A1 | 7/2013 | Kikuchi et al. |
| 2013/0216783 A1 | 8/2013 | Duan et al. |
| 2013/0216821 A1 | 8/2013 | Sun et al. |
| 2013/0224498 A1 | 8/2013 | Sun et al. |
| 2013/0224675 A1 | 8/2013 | Park |
| 2013/0273313 A1 | 10/2013 | Sun et al. |
| 2013/0273327 A1 | 10/2013 | Sun et al. |
| 2013/0284373 A1 | 10/2013 | Sun et al. |
| 2013/0288037 A1 | 10/2013 | Sun et al. |
| 2013/0333592 A1 | 12/2013 | Nakagawa et al. |
| 2014/0030486 A1 | 1/2014 | Sun et al. |
| 2014/0030533 A1 | 1/2014 | Sun et al. |
| 2014/0031533 A1 | 1/2014 | Liu et al. |
| 2014/0037969 A1 | 2/2014 | Margolies et al. |
| 2014/0154465 A1 | 6/2014 | Sun et al. |
| 2014/0159325 A1 | 6/2014 | Parkhe et al. |
| 2014/0177123 A1 | 6/2014 | Thach et al. |
| 2014/0349073 A1 | 11/2014 | Sun et al. |
| 2014/0363596 A1 | 12/2014 | Sun et al. |
| 2014/0377504 A1 | 12/2014 | Sun et al. |
| 2015/0004418 A1 | 1/2015 | Sun et al. |
| 2015/0021324 A1 | 1/2015 | Sun et al. |
| 2015/0024155 A1 | 1/2015 | Sun et al. |
| 2015/0064406 A1 | 3/2015 | Harada et al. |
| 2015/0075714 A1 | 3/2015 | Sun et al. |
| 2015/0079370 A1 | 3/2015 | Sun et al. |
| 2015/0133285 A1 | 5/2015 | Sun et al. |
| 2015/0158775 A1 | 6/2015 | Sun et al. |
| 2015/0218057 A1 | 8/2015 | Duan et al. |
| 2015/0270108 A1 | 9/2015 | Sun et al. |
| 2015/0275361 A1 | 10/2015 | Lubomirsky et al. |
| 2015/0275375 A1 | 10/2015 | Kim et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329430 A1 | 11/2015 | Sun et al. |
| 2015/0329955 A1 | 11/2015 | Sun et al. |
| 2016/0042924 A1 | 2/2016 | Kim et al. |
| 2016/0079040 A1 | 3/2016 | Park et al. |
| 2016/0211121 A1 | 7/2016 | Sun et al. |
| 2016/0326626 A1 | 11/2016 | Sun et al. |
| 2017/0130319 A1 | 5/2017 | Sun et al. |
| 2017/0133207 A1 | 5/2017 | Sun et al. |

FOREIGN PATENT DOCUMENTS

| | | |
|---|---|---|
| EP | 0330196 | 8/1989 |
| JP | H07-075893 | 3/1995 |
| JP | H10-45461 | 2/1998 |
| JP | 2002-087878 | 3/2002 |
| JP | 2004-107718 | 4/2004 |
| JP | 2004290786 A | 10/2004 |
| JP | 2005-279481 | 10/2005 |
| JP | 2006-207012 | 8/2006 |

(56) References Cited

FOREIGN PATENT DOCUMENTS

| | | |
|---|---|---|
| JP | 2007138288 | 6/2007 |
| JP | 2007191794 | 8/2007 |
| JP | 2007-530792 | 11/2007 |
| JP | 2009-536732 | 10/2009 |
| JP | 2010006641 | 1/2010 |
| JP | 2010-106327 | 5/2010 |
| JP | 2010-229492 | 10/2010 |
| JP | 2011508092 A | 3/2011 |
| JP | 2013-124378 | 6/2013 |
| KR | 1020030025007 | 3/2003 |
| KR | 1020070013118 | 1/2007 |
| KR | 10-2011-0028378 | 3/2011 |
| KR | 10-2011-0117845 | 10/2011 |
| KR | 101108692 | 1/2012 |
| TW | 200404754 | 4/2004 |
| TW | 2010030891 | 8/2010 |
| TW | 201126600 | 8/2011 |
| WO | 2011/0024581 | 4/2001 |
| WO | 2002000968 | 1/2002 |
| WO | 2003/0100843 | 12/2003 |
| WO | 2010033326 | 3/2012 |
| WO | 2013126466 | 8/2013 |
| WO | 2013155220 | 10/2013 |
| WO | 2013162909 | 10/2013 |
| WO | 2014018830 | 1/2014 |
| WO | 2014018835 | 1/2014 |
| WO | 2014190211 | 11/2014 |
| WO | 2014197203 | 12/2014 |
| WO | 2014205212 | 12/2014 |
| WO | 2015009745 | 1/2015 |
| WO | 2015013070 | 1/2015 |
| WO | 2015042196 | 3/2015 |
| WO | 2015073458 | 5/2015 |
| WO | 2015153123 | 10/2015 |
| WO | 2015164263 | 10/2015 |
| WO | 2015164638 | 10/2015 |
| WO | 2015171801 | 11/2015 |
| WO | 2015175987 | 11/2015 |

OTHER PUBLICATIONS

English Translation for Office Action issued for CN201480030094.5 dated May 16, 2018, 22 pages.

English Translation for Office Action issued for TW103121416 dated Jun. 20, 2018.

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereol 2011;30:53-62, Published Jan. 27, 2011.

Smith et al., "Very Low Pressure Plasma Spray—A Review of an Emerging Technology in the Thermal Spray Community," Coatings 2011, 1, 117-132, doi: 10.3390/coatings1020117, Published Dec. 20, 2011.

Zircotec—Plasma sprayed ceramic thermal coatings, http://www.zircotec.com/page/plasma-spray-processing/39, downloaded Apr. 4, 2014.

Nakamura et al., "Effects of Pores on Mechanical Properties of Plasma-Sprayed Ceramic Coatings," J. Am. Ceram. Soc., 83 [3] 578-84, Mar. 2000.

Govindarajan et al., "In situ Particle Generation and Splat Formation During Solution Precursor Plasma Spraying of Yttria-Stabilized Zirconia Coatings," J Am. Ceram. Soc., 1-9 (2011).

"Thermal Spraying," definition, Wikipedia, http://en.wikipedia.org/wiki/Thermal_spraying, downloaded Apr. 14, 2014.

Gorse, C. et al. Dictionary of Construction, surveying and Civil Engineering, 2012, Oxford University Press, p. 442. Online version available at http://app.knovel.com/hotlink/toc/Id:kpDCSCE002/dictionary-construction/dictionary-construction (Year: 2012).

Glushkova, V.B. et al. "Phase Formation in the ZrO2—Nd2O3(Y2O3)—Al2O3(Cr2O3) Systems and Properties of Materials Based on Them", 2001, Plenum Publishing Corporation, Refractories and Industrial Ceramics, vol. 42, Nos. 1-2, pp. 71-75.

Search Report for Taiwan Patent Application No. 103121416 dated Nov. 29, 2017.

Search Report for Chinese Patent Application No. 2014800300945 dated Oct. 24, 2017.

Greenwood, N.N. Earnshaw, A . . . (1997). Chemistry of the Elements (2nd Edition)—Appendix 5: Effective Ionic Radii . Elsevier, Online version available at: app.knovel.com/hotlink/pdf/id:kt003BKDL1/chemistry-elements-2nd/effective-ionic-radii.

Smallman, R. E. Ngan, A. H. W . . . (2007). Physical Metallurgy and Advanced Materials (7th Edition)—10. Non-Metallics I—Ceramics, Glass, Glass-Ceramics. Elsevier. Online version available at: app.knovel.com/hotlink/pdf/id:kt0083F3A1/.

Hass et al., "Gas jet assisted vapor deposition of yttria stabilized zirconia," Department of Materials Science and Engineering, School of Engineering and Applied Science, published Feb. 27, 2009 University of Virginia, Charlottesville, Virginia.

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

Refke, et al "LPPS thin film technology for the application of TBC systems", International Thermal Spray Conference, Basel Switzerland, May 2-4, 2005, 6 pages.

Lewis, Richard J.Sr., editor; Hawley's Condensed Chemical Dictionary, 12th edition, 1993, pp. 540 & 990, Van Nostrand Reinhold company, New York.

Wachtman, J.B. et al., ed. "Ceramic Films and Coatings", Ch. 6, "Optical Thin Films", copyright 1993, Noyes Publications, pp. 189-223. Online version available at: app.knovel.com/hotlink/pdf/Id:kt00194M71/ceramic-films-coatings/optical-thin-films.

International Search Report & Written Opinion of the International Searching Authority dated Oct. 24, 2014, in International Application No. PCT/US2014/043178.

Taffner et al., "Preparation and Microstructural Analysis of High-Performance Ceramics," ASM Handbook vol. 9: Metallography and Microstructures, 2004, 11 pages, ASM International, Materials Park, Ohio, USA.

\* cited by examiner

PLASMA EROSION RESISTANT RARE-EARTH OXIDE BASED THIN FILM COATINGS

RELATED APPLICATIONS

This patent application is a continuation of U.S. patent application Ser. No. 15/814,601, filed Nov. 16, 2017, which is a divisional application of U.S. patent application Ser. No. 14/306,583, filed Jun. 17, 2014, which claims the benefit under 35 U.S.C. § 119(e) of U.S. Provisional Application No. 61/837,595, filed Jun. 20, 2013.

TECHNICAL FIELD

Embodiments of the present invention relate, in general, to chamber components having a thin film plasma resistant protective layer.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide an article such as a chamber component for a processing chamber having a thin film protective layer on one or more surfaces of the article. The protective layer may have a thickness below approximately 20 microns, and may provide plasma corrosion resistance for protection of the article. The protective layer may be formed on the article using ion assisted deposition (IAD) or physical vapor deposition (PVD). The thin film protective layer may be used as a top coat over a thick film protective layer, which may have been formed using, for example, plasma spraying techniques. In some embodiments, a thin film protective layer stack comprising two or more thin film protective layers is formed on the article. In such embodiments, each thin film protective layer may be formed by IAD or PVD and may be around 20 microns or less in thickness. The thin film protective layer may be $Y_3Al_5O_{12}$, $Y_4Al_2O_9$, $Er_2O_3$, $Gd_2O_3$, $Er_3Al_5O_{12}$, $Gd_3Al_5O_{12}$, or a ceramic compound comprising $Y_4Al_2O_9$ and a solid-solution of $Y_2O_3$—$ZrO_2$. The improved erosion resistance provided by the thin film protective layer may improve the service life of the article, while reducing maintenance and manufacturing cost.

Figure 1:
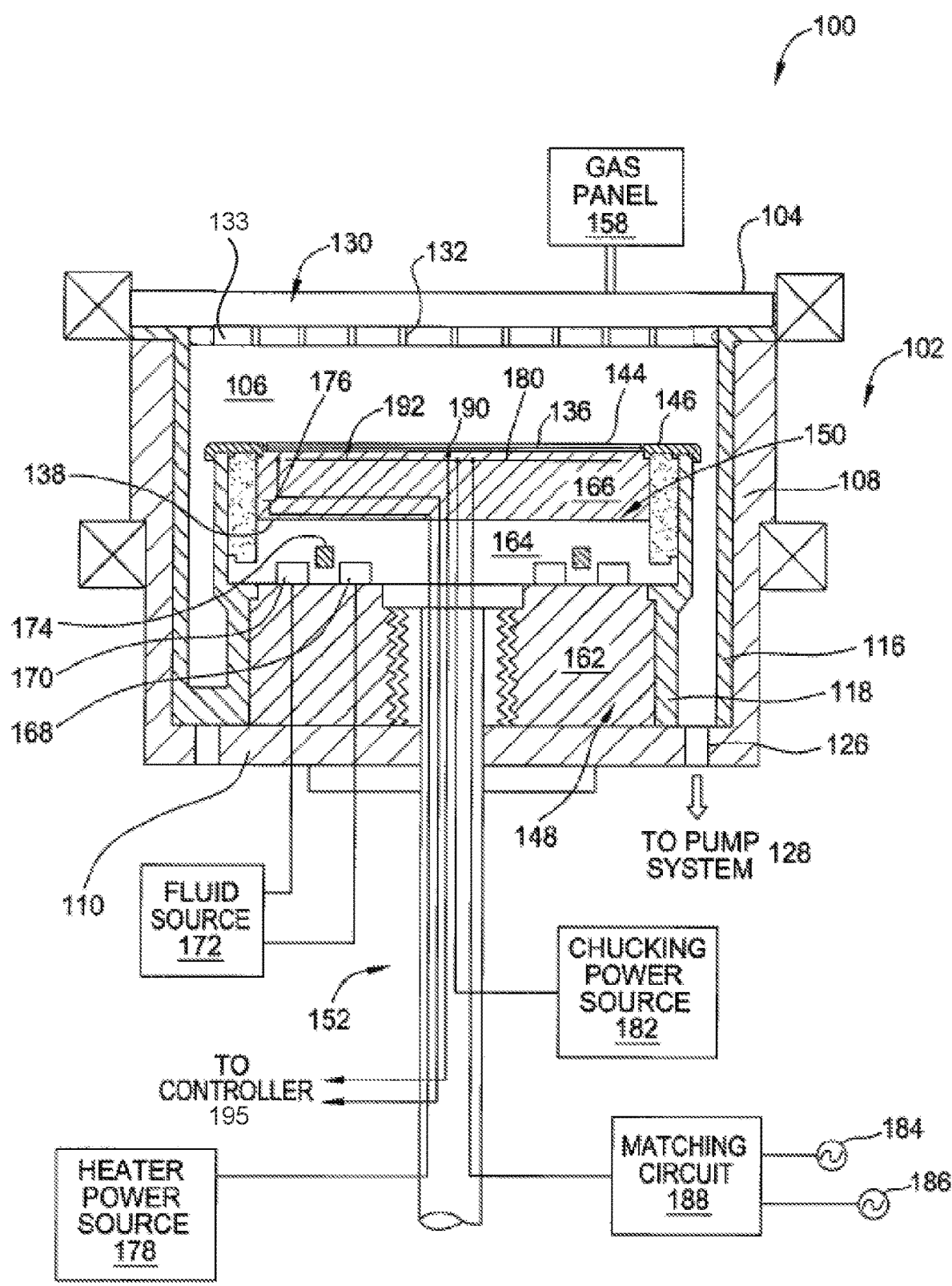
FIG. 1 depicts a sectional view of one embodiment of a processing chamber.

FIG. 1 is a sectional view of a semiconductor processing chamber 100 having one or more chamber components that are coated with a thin film protective layer in accordance with embodiments of the present invention. The processing chamber 100 may be used for processes in which a corrosive plasma environment is provided. For example, the processing chamber 100 may be a chamber for a plasma etcher or plasma etch reactor, a plasma cleaner, and so forth. Examples of chamber components that may include a thin film protective layer include a substrate support assembly 148, an electrostatic chuck (ESC) 150, a ring (e.g., a process kit ring or single ring), a chamber wall, a base, a gas distribution plate, a showerhead, a liner, a liner kit, a shield, a plasma screen, a flow equalizer, a cooling base, a chamber viewport, a chamber lid 104, and so on. The thin film protective layer, which is described in greater detail below, may include $Y_3Al_5O_{12}$ (YAG), $Y_4Al_2O_9$ (YAM), $Er_2O_3$, $Gd_2O_3$, $Er_3Al_5O_{12}$ (EAG), $Gd_3Al_5O_{12}$ (GAG) and/or a ceramic compound comprising $Y_4Al_2O_9$ and a solid-solution of $Y_2O_3$—$ZrO_2$. The thin film protective layer may also include $Y_2O_3$ and $Y_2O_3$ based ceramics, $Er_2O_3$ based ceramics, $Gd_2O_3$ based ceramics, and other rare earth oxides.

The thin film protective layer may be an IAD or PVD coating applied over different ceramics including oxide based ceramics, Nitride based ceramics and Carbide based ceramics. Examples of oxide based ceramics include $SiO_2$ (quartz), $Al_2O_3$, $Y_2O_3$, and so on. Examples of Carbide based ceramics include SiC, Si—SiC, and so on. Examples of Nitride based ceramics include AlN, SiN, and so on. IAD or PVD coating target material can be calcined powders, preformed lumps (e.g., formed by green body pressing, hot pressing, and so on), a sintered body (e.g., having 50-100% density), a machined body (e.g., can be ceramic, metal, or a metal alloy), or a pre-melt (100% density). The substrate can also be metal substrates such as Al, Ti, stainless steel, or anodized Al.

As illustrated, the substrate support assembly 148 has a thin film protective layer 136, in accordance with one embodiment. However, it should be understood that any of the other chamber components, such as those listed above, may also include a thin film protective layer.

In one embodiment, the processing chamber 100 includes a chamber body 102 and a showerhead 130 that enclose an interior volume 106. The showerhead may include a showerhead base and a showerhead gas distribution plate. Alternatively, the showerhead 130 may be replaced by a lid and a nozzle in some embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include a thin film protective layer.

An outer liner 116 may be disposed adjacent the sidewalls 108 to protect the chamber body 102. The outer liner 116 may be fabricated and/or coated with a thin film protective layer. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 is used for processing chambers used for dielectric etch (etching of dielectric materials). The showerhead 130 includes a gas distribution plate (GDP) 133 having multiple gas delivery holes 132 throughout the GDP 133. The showerhead 130 may include the GDP 133 bonded to an aluminum base or an anodized aluminum base 104. The GDP 133 may be made from Si or SiC, or may be a ceramic such as $Y_2O_3$, $Al_2O_3$, YAG, and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead base 104, GDP 133 and/or nozzle may be coated with a thin film protective layer.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The substrate support assembly 148 is disposed in the interior volume 106 of the processing chamber 100 below the showerhead 130 or lid. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may be coated with a thin film protective layer.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. An upper surface of the electrostatic puck 166 is covered by the thin film protective layer 136 in the illustrated embodiment. In one embodiment, the thin film protective layer 136 is disposed on the upper surface of the electrostatic puck 166. In another embodiment, the thin film protective layer 136 is disposed on the entire exposed surface of the electrostatic chuck 150 including the outer and side periphery of the thermally conductive base 164 and the electrostatic puck 166. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, that may be formed in an upper surface of the puck 166 and/or the thin film protective layer 136. The gas passages may be fluidly coupled to a source of a heat transfer (or backside) gas such as He via holes drilled in the puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2A:
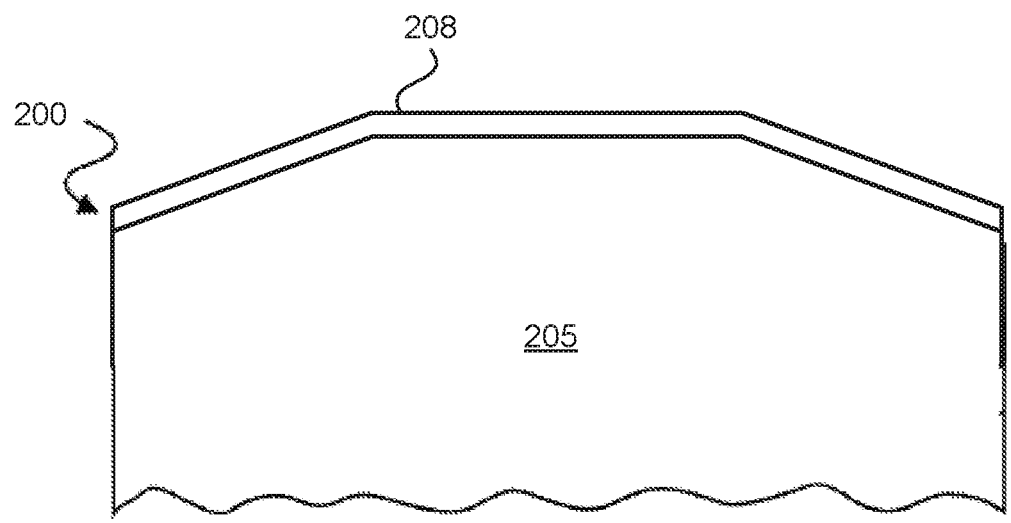
FIGS. 2A-5 depict cross sectional side views of example articles with protective layer stacks on one surface.

FIGS. 2A-5 illustrate cross sectional side views of articles (e.g., chamber components) covered by one or more thin film protective layers. Referring to FIG. 2A, at least a portion of a base or body 205 of an article 200 is coated by a thin film protective layer 208. The article 200 may be a chamber component, such as a substrate support assembly, an electrostatic chuck (ESC), a ring (e.g., a process kit ring or single ring), a chamber wall, a base, a gas distribution plate or showerhead, a liner, a liner kit, a shield, a plasma screen, a flow equalizer, a cooling base, a chamber viewport, a chamber lid, and so on. The body 205 of the article 200 may be a metal, a ceramic, a metal-ceramic composite, a polymer, or a polymer-ceramic composite.

Various chamber components are composed of different materials. For example, an electrostatic chuck may be composed of a ceramic such as $Al_2O_3$ (alumina), AlN (aluminum nitride), TiO (titanium oxide), TiN (titanium nitride) or SiC (silicon carbide) bonded to an anodized aluminum base.

$Al_2O_3$, AlN and anodized aluminum have poor plasma erosion resistance. When exposed to a plasma environment with a Fluorine chemistry and/or reducing chemistry, an electrostatic puck of an electrostatic chuck may exhibit degraded wafer chucking, increased He leakage rate, wafer front-side and back-side particle production and on-wafer metal contamination after about 50 radio frequency hours (RFHrs) of processing. A radio frequency hour is an hour of processing.

A lid for a plasma etcher used for conductor etch processes may be a sintered ceramic such as $Al_2O_3$ since $Al_2O_3$ has a high flexural strength and high thermal conductivity. However, $Al_2O_3$ exposed to Fluorine chemistries forms AlF particles as well as aluminum metal contamination on wafers. Some chamber lids have a thick film protective layer on a plasma facing side to minimize particle generation and metal contamination and to prolong the life of the lid. However, most thick film coating techniques have a long lead time. Additionally, for most thick film coating techniques special surface preparation is performed to prepare the article to be coated (e.g., the lid) to receive the coating. Such long lead times and coating preparation steps can increase cost and reduce productivity, as well as inhibit refurbishment. Additionally, most thick-film coatings have inherent cracks and pores that might degrade on-wafer defect performance.

A process kit ring and a single ring are used to seal and/or protect other chamber components, and are typically manufactured from quartz or silicon. These rings may be disposed around a supported substrate (e.g., a wafer) to ensure a uniform plasma density (and thus uniform etching). However, quartz and silicon have very high erosion rates under various etch chemistries (e.g., plasma etch chemistries). Additionally, such rings may cause particle contamination when exposed to plasma chemistries. The process kit ring and single ring may also consist of sintered ceramics such as YAG and or ceramic compound comprising $Y_4Al_2O_9$ and a solid-solution of $Y_2O_3$—$ZrO_2$.

The showerhead for an etcher used to perform dielectric etch processes is typically made of anodized aluminum bonded to a SiC faceplate. When such a showerhead is exposed to plasma chemistries including fluorine, AlF may form due to plasma interaction with the anodized aluminum base. Additionally, a high erosion rate of the anodized aluminum base may lead to arcing and ultimately reduce a mean time between cleaning for the showerhead.

A chamber viewport (also known as an endpoint window) is a transparent component typically made of quartz or sapphire. Various optical sensors may be protected by the viewport, and may make optical sensor readings through the viewport. Additionally, a viewport may enable a user to visually inspect or view wafers during processing. Both quartz and sapphire have poor plasma erosion resistance. As the plasma chemistry erodes and roughens the viewport, the optical properties of the viewport change. For example, the viewport may become cloudy and/or an optical signal passing through the viewport may become skewed. This may impair an ability of the optical sensors to collect accurate readings. However, thick film protective layers may be inappropriate for use on the viewport because these coatings may occlude the viewport.

The examples provided above set forth just a few chamber components whose performance may be improved by use of a thin film protective layer as set forth in embodiments herein.

Referring back to FIG. 2A, a body 205 of the article 200 may include one or more surface features, such as the mesa illustrated in FIG. 2A. For an electrostatic chuck, surface features may include mesas, sealing bands, gas channels, helium holes, and so forth. For a showerhead, surface features may include a bond line, hundreds or thousands of holes for gas distribution, divots or bumps around gas distribution holes, and so forth. Other chamber components may have other surface features.

The thin film protective layer 208 formed on the body 205 may conform to the surface features of the body 205. As shown, the thin film protective layer 208 maintains a relative shape of the upper surface of the body 205 (e.g., telegraphing the shapes of the mesa). Additionally, the thin film coating may be thin enough so as not to plug holes in the showerhead or He holes in the electrostatic chuck. In one embodiment, the thin film protective layer 208 has a thickness of below about 20 microns. In a further embodiment, the thin film protective layer has a thickness of between about 0.5 microns to about 7 microns.

The thin film protective layer 208 is a deposited ceramic layer that may be formed on the body 205 of the article 200 using an ion assisted deposition (IAD) process or a physical vapor deposition (PVD) process. One example IAD process that may be performed is electron beam ion assisted deposition (EB-IAD). The IAD or PVD deposited thin film protective layer 208 may have a relatively low film stress (e.g., as compared to a film stress caused by plasma spraying or sputtering). The relatively low film stress may cause the lower surface of the body 205 to be very flat, with a curvature of less than about 50 microns over the entire body for a body with a 12 inch diameter. The IAD or PVD deposited thin film protective layer 208 may additionally have a porosity that is less than 1%, and less than about 0.1% in some embodiments. Therefore, the IAD or PVD deposited protective layer is a dense structure, which can have performance benefits for application on a chamber component. Additionally, the IAD or PVD deposited protective layer 208 may be deposited without first roughening the upper surface of the body 205 or performing other time consuming surface preparation steps. Since roughening the body may reduce a breakdown voltage of the body 205, the ability to apply the thin film protective layer 208 without first roughening the body 205 may be beneficial for some applications (e.g., for an electrostatic chuck).

Examples of ceramics that may be used to form the thin film protective layer 208 include $Y_3Al_5O_{12}$, $Y_4Al_2O_9$, $Er_2O_3$, $Gd_2O_3$, $Er_3Al_5O_{12}$, $Gd_3Al_5O_{12}$, or a ceramic compound comprising $Y_4Al_2O_9$ and a solid-solution of $Y_2O_3$—$ZrO_2$ ($Y_2O_3$—$ZrO_2$ solid solution). Other Er based and/or Gd based plasma resistant rare earth oxides may also be used to form the thin film protective layer 208. In one embodiment, the thin film protective layer is YAG composed of 35 mol % $Y_2O_3$ and 65 mol % $Al_2O_3$. In another embodiment, the ceramic coating can be YAG composed of 30-40 mol % $Y_2O_3$ and 60-70 mol % $Al_2O_3$. In one embodiment, the ceramic compound includes 62.93 mol % $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In other embodiments, other distributions may also be used for the ceramic compound. Any of the aforementioned ceramics may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

TABLE 1

Material properties for IAD deposited YAG, $Er_2O_3$, BAG and ceramic compound comprising $Y_4Al_2O_9$ and a solid-solution of $Y_2O_3$—$ZrO_2$.

| Property | Bulk 92% $Al_2O_3$ | Thin-film coating | | | |
|---|---|---|---|---|---|
| | | Ceramic Compound | YAG | $Er_2O_3$ | EAG |
| Breakdown Voltage (V) | 363 | 2500 (5 μm coating) | 6800 (5 μm) | 527 (5 μm coating) | 900 (5 μm coating) |
| Volume Resistivity (Ω·cm) | >0.01E16 | 4.1E16 | 11.3E16 | | |
| Dielectric Constant | 9.2 | 9.83 +/− 0.04 | 9.76 +/− 0.01 | 9.67 | 9.54 |
| Loss Tangent | 5E-4 | 4E-4 | 4E-4 | 4E-4 | 4E-4 |
| Thermal Conductivity (W/m-K) | 18 | 19.9 | 20.1 | 19.4 | 19.2 |
| Roughness (μin) | 8 | Unchanged | Unchanged | Unchanged | Unchanged |
| Seal Band Mesa Heights (μin) | 8.66 OSB 7.44 ISB | 8.5 OSB 7.33 ISB | 8.43 OSB 5.69 ISB | | |
| Adhesion Over 92% $Al_2O_3$ (MPa) | N/A | >28 | >32 | | |
| Hermicity (He leak rate) ($cm^3$/s) | <1E-6 | 1.2E-9 | 4.4E-10 | 5.5E-9 | 9.5E-10 |
| Hardness (GPa) | 12.14 | 7.825 | 8.5 | 5.009 | 9.057 |
| Wear Rate (nm/RFhr) | 0.2 | 0.14 | | 0.113 | 0.176 |

Table 1 shows material properties for a substrate of 92% $Al_2O_3$ (alumina) and for various thin film protective layers coating a substrate of 92% $Al_2O_3$. As shown, the alumina substrate has a breakdown voltage of 363 Volts/mil (V/mil). In contrast, a 5 micron (μm) coating of the IAD deposited ceramic compound comprising $Y_4Al_2O_9$ and a solid-solution of $Y_2O_3$—$ZrO_2$ has a breakdown voltage of 2500 V (much more than the normalized value of 363 Volts/mil for alumina). A 5 μm coating of the IAD deposited YAG has a breakdown voltage of 6800 V. A 5 μm coating of the IAD deposited $Er_2O_3$ has a breakdown voltage of 527 V. A 5 μm coating of the IAD deposited EAG has a breakdown voltage of 900 V.

A volume resistivity of the alumina is around $0.01 \times 10^{16}$ (0.01E16) Ω·cm at room temperature. A volume resistivity of the ceramic compound thin film protective layer is about 4.1E16 Ω·cm at room temperature, and a volume resistivity of the YAG thin film protective layer is about 11.3E16 Ω·cm at room temperature.

A dielectric constant of the alumina is about 9.2, a dielectric constant of the ceramic compound thin film is about 9.83, a dielectric constant of the YAG thin film is about 9.76, a dielectric constant of the $Er_2O_3$ thin film is about 9.67, and a dielectric constant of the EAG thin film is about 9.54. A loss tangent of the alumina is about 5E-4, a loss tangent of the ceramic compound thin film is about 4E-4, a loss tangent of the YAG thin film is about 4E-4, a loss tangent of the $Er_2O_3$ thin film is about 4E-4, and a loss tangent of the EAG thin film is about 4E-4. A thermal conductivity of the alumina is about 18 W/m-K, a thermal conductivity of the ceramic compound thin film is about 19.9 W/m-K, a thermal conductivity of the YAG thin film is about 20.1 W/m-K, a thermal conductivity of the $Er_2O_3$ thin film is about 19.4 W/m-K, and a thermal conductivity of the EAG thin film is about 19.2 W/m-K.

The alumina substrate may have a starting roughness of approximately 8 microinches in one embodiment, and that starting roughness may be approximately unchanged in all of the thin film protective layers. Feature heights such as inner seal band (ISB) mesa heights and outer seal band (OSB) mesa heights may also be approximately unchanged as a result of deposition of any of the thin film protective layers, as shown. Adhesion strength of the thin film protective layers to the alumina substrate may be above 28 mega pascals (MPa) for the ceramic compound thin film and above 32 MPa for the YAG thin film. Adhesion strength may be determined by measuring the amount of force used to separate the thin film protective layer from the substrate. Hermiticity measures the sealing capacity that can be achieved using the thin film protective layer. As shown, a He leak rate of around 1E-6 cubic centimeters per second ($cm^3$/s) can be achieved using alumina, a He leak rate of around 1.2E-9 can be achieved using the ceramic compound, a He leak rate of around 4.4E-10 can be achieved using YAG, a He leak rate of around 5.5E-9 can be achieved using $Er_2O_3$ and a He leak rate of around 9.5E-10 can be achieved using EAG. Lower He leak rates indicate an improved seal. Each of the example thin film protective layers has a lower He leak rate than the $Al_2O_3$ substrate.

Each of $Y_3Al_5O_{12}$, $Y_4Al_2O_9$, $Er_2O_3$, $Gd_2O_3$, $Er_3Al_5O_{12}$, $Gd_3Al_5O_{12}$, and the ceramic compound comprising $Y_4Al_2O_9$ and a solid-solution of $Y_2O_3$—$ZrO_2$ have a high hardness that may resist wear during plasma processing. As shown, alumina has a Vickers hardness (5 Kgf) of around 12.14 Giga pascals (GPa), the ceramic compound has a hardness of around 7.825 GPa, YAG has a hardness of around 8.5 GPa, $Er_2O_3$ has a hardness of around 5.009 GPa, and EAG has a hardness of around 9.057 GPa. A measured wear rate of alumina is around 0.2 nanometers per radio frequency hour (nm/RFhr), a wear rate of the ceramic compound is about 0.14 nm/RFhr, a wear rate of $Er_2O_3$ is about 0.113 nm/RFhr, and a wear rate of EAG is about 0.176 nm/RFhr.

Note that the $Y_3Al_5O_{12}$, $Y_4Al_2O_9$, $Er_2O_3$, $Gd_2O_3$, $Er_3Al_5O_{12}$, $Gd_3Al_5O_{12}$, and the ceramic compound may be modified such that the material properties and characteristics identified above may vary by up to 30% in some embodiments. Accordingly, the described values for these material properties should be understood as example achievable values. The ceramic thin film protective layers described herein should not be interpreted as being limited to the provided values.

Figure 2B:
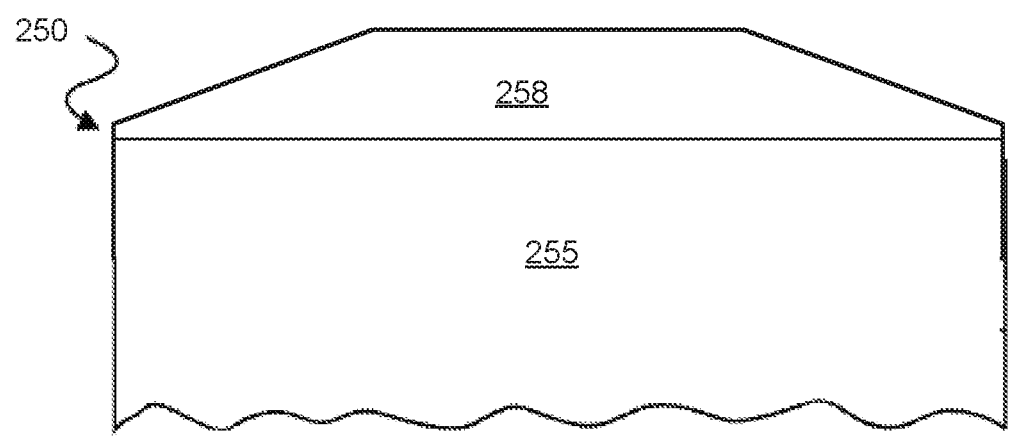

FIG. 2B illustrates a cross sectional side view of one embodiment of an article 250 having a body 255 coated by a thin film protective layer 258. As shown, the body 255 may be devoid of features. In one embodiment, the body 255 is polished prior to deposition of the thin film protective layer 258. Rather than having features in the body 255, features may be formed in the thin film protective layer 258. For example, the thin film protective layer 258 may be masked and then etched or bead blasted to remove unmasked portions of the thin film protective layer 258. The features can also be formed by masking the substrate and then applying the thin coating. Formed features may include mesas, channels, seal rings, exposed bond lines (e.g., of a showerhead), and so forth. Additionally, holes may be drilled in the thin film protective layer, such as by laser drilling. If features are to be formed in the thin film protective layer 258, the thin film protective layer should preferably have a thickness that is great enough to accommodate the features. For example, if 12 μm mesas are to be formed in the thin film protective layer, then the thin film protective layer 258 should have a thickness that is greater than 12 μm. In other embodiments, some features may be formed in the body 255, and other features may be formed in the thin film protective layer 258.

Figure 3:
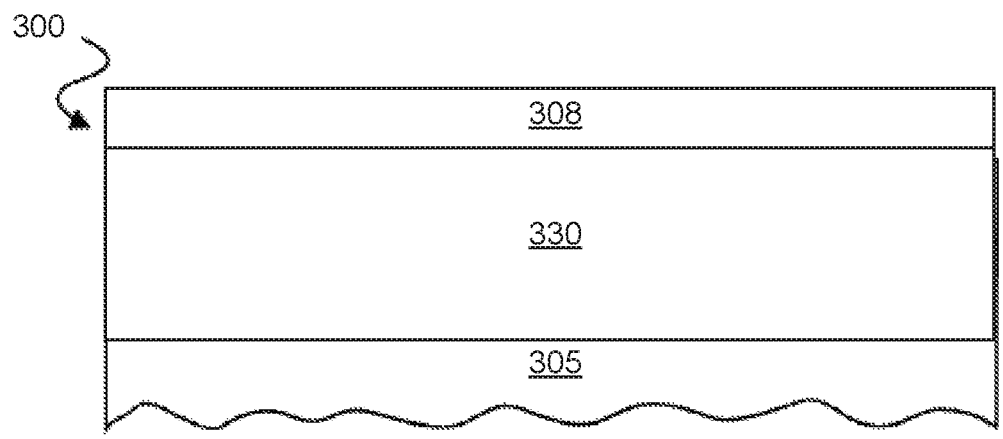

FIG. 3 illustrates a cross sectional side view of one embodiment of an article 300 having a thick protective layer 330 and a thin film protective layer 308. The thick protective layer may be $Y_3Al_5O_{12}$, $Y_4Al_2O_9$, $Y_2O_3$, or the ceramic compound comprising $Y_4Al_2O_9$ and a solid-solution of $Y_2O_3$—$ZrO_2$. Other plasma resistant ceramics may also be used for the thick protective layer 330.

The thick protective layer 330 may be a thick film protective layer, which may have been thermally sprayed (e.g., plasma sprayed) onto the body 305. An upper surface of the body 305 may be roughened prior to plasma spraying the thick film protective layer onto it. The roughening may be performed, for example, by bead blasting the body 305. Roughening the upper surface of the body provides anchor points to create a mechanical bond between the plasma sprayed thick film protective layer and the body 305 for better adhesion. The thick film protective layer may have an as sprayed thickness of up to about 200 microns or thicker, and may be ground down to a final thickness of approximately 50 microns in some embodiments. A plasma sprayed thick film protective layer may have a porosity of about 2-4%.

Alternatively, the thick protective layer 330 may be a bulk sintered ceramic that has been bonded to the body 305. The thick protective layer 330 may be provided, for example, as a thin ceramic wafer having a thickness of approximately 200 microns.

The thin film protective layer 308 may be applied over the thick protective layer 330 using IAD or PVD. The thin film protective layer 308 may act as a top coat, and may act as an erosion resistant barrier and seal an exposed surface of the thick protective layer 330 (e.g., seal inherent surface cracks and pores in the thick protective layer 330).

Figure 4:
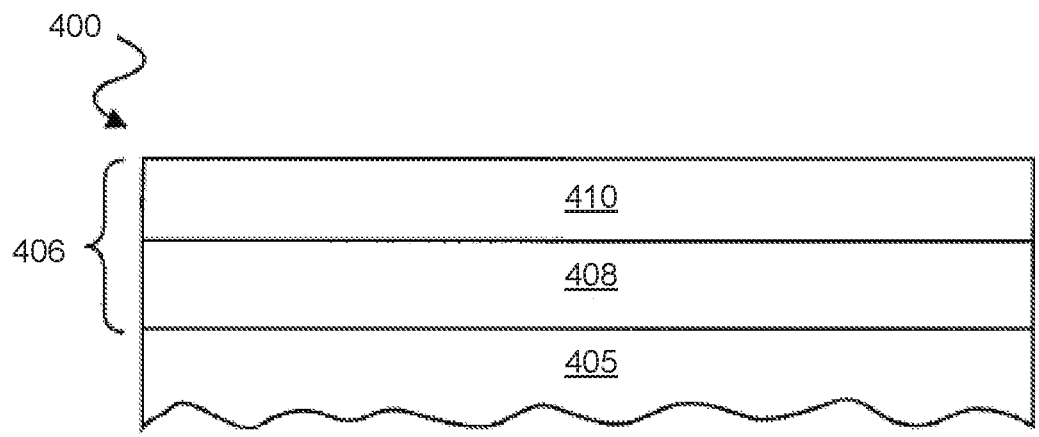

FIG. 4 illustrates a cross sectional side view of one embodiment of an article 400 having a thin film protective layer stack 406 deposited over a body 405 of the article 400. Each thin film protective layer 408, 410 in the thin film protective layer stack 406 may be one of $Y_3Al_5O_{12}$ (YAG), $Y_4Al_2O_9$, $Er_2O_3$, $Gd_2O_3$, $Er_3Al_5O_{12}$, $Gd_3Al_5O_{12}$, and the ceramic compound comprising $Y_4Al_2O_9$ and a solid-solution of $Y_2O_3$—$ZrO_2$. In one embodiment, the same ceramic material is not used for two adjacent thin film protective layers. However, in another embodiment adjacent layers may be composed of the same ceramic.

Figure 5:
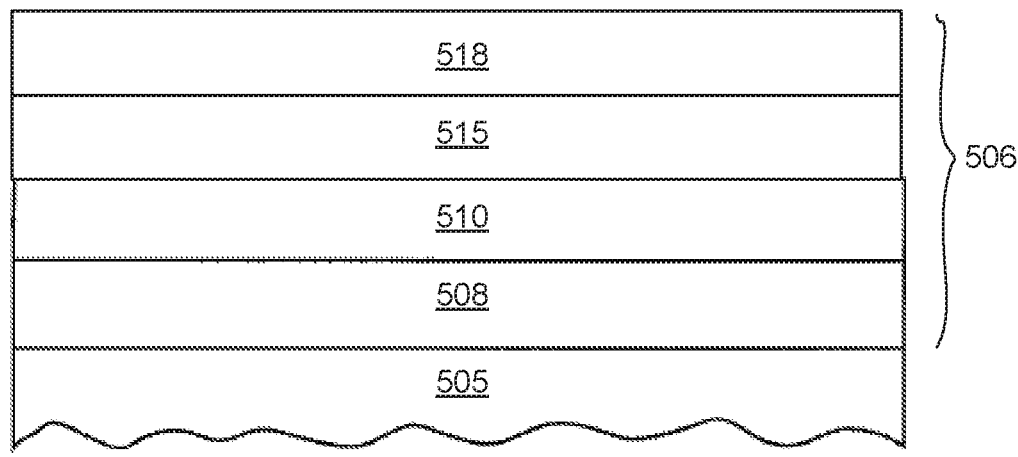

FIG. 5 illustrates a cross sectional side view of another embodiment of an article 500 having a thin film protective layer stack 506 deposited over a body 505 of the article 500. Article 500 is similar to article 400, except that thin film protective layer stack 506 has four thin film protective layers 508, 510, 515, 518.

The thin film protective layer stacks (such as those illustrated) may have any number of thin film protective layers. The thin film protective layers in a stack may all have the same thickness, or they may have varying thicknesses. Each of the thin film protective layers may have a thickness of less than approximately 20 microns, and less than approximately 10 microns in some embodiments. In one example, a first layer 408 may have a thickness of 3 microns, and a second layer 410 may have a thickness of 3 microns. In another example, first layer 508 may be a YAG layer having a thickness of 2 microns, second layer 510 may be a compound ceramic layer having a thickness of 1 micron, third layer 515 may be a YAG layer having a thickness of 1 micron, and fourth layer 518 may be a compound ceramic layer having a thickness of 1 micron.

The selection of the number of ceramic layers and the composition of the ceramic layers to use may be based on a desired application and/or a type of article being coated. EAG and YAG thin film protective layers formed by IAD and PVD typically have an amorphous structure. In contrast, the IAD and PVD deposited compound ceramic and $Er_2O_3$ layers typically have a crystalline or nano-crystalline structure. Crystalline and nano-crystalline ceramic layers may generally be more erosion resistant than amorphous ceramic layers. However, in some instances thin film ceramic layers having a crystalline structure or nano-crystalline structure may experience occasional vertical cracks (cracks that run approximately in the direction of the film thickness and approximately perpendicular to the coated surface). Such vertical cracks may be caused by lattice mismatch and may be points of attack for plasma chemistries. Each time the article is heated and cooled, the mismatch in coefficients of thermal expansion between the thin film protective layer and the substrate that it coats cause stress on the thin film protective layer. Such stress may be concentrated at the vertical cracks. This may cause the thin film protective layer to eventually peel away from the substrate that it coats. In contrast, if there are not vertical cracks, then the stress is approximately evenly distributed across the thin film. Accordingly, in one embodiment a first layer 408 in the thin film protective layer stack 406 is an amorphous ceramic such as YAG or EAG, and the second layer 410 in the thin film protective layer stack 406 is a crystalline or nano-crystalline ceramic such as the ceramic compound or $Er_2O_3$. In such an embodiment, the second layer 410 may provide greater plasma resistance as compared to the first layer 408. By forming the second layer 410 over the first layer 408 rather than directly over the body 405, the first layer 408 acts as a buffer to minimize lattice mismatch on the subsequent layer. Thus, a lifetime of the second layer 410 may be increased.

In another example, each of the body, $Y_3Al_5O_{12}$ (YAG), $Y_4Al_2O_9$, $Er_2O_3$, $Gd_2O_3$, $Er_3Al_5O_{12}$, $Gd_3Al_5O_{12}$, and the ceramic compound comprising $Y_4Al_2O_9$ and a solid-solution of $Y_2O_3$—$ZrO_2$ may have a different coefficient of thermal expansion. The greater the mismatch in the coefficient of thermal expansion between two adjacent materials, the greater the likelihood that one of those materials will eventually crack, peel away, or otherwise lose its bond to the other material. The protective layer stacks 406, 506 may be formed in such a way to minimize mismatch of the coefficient of thermal expansion between adjacent layers (or between a layer and a body 405, 505). For example, body 505 may be alumina, and EAG may have a coefficient of thermal expansion that is closest to that of alumina, followed by the coefficient of thermal expansion for YAG, followed by the coefficient of thermal expansion for the compound ceramic. Accordingly, first layer 508 may be EAG, second layer 510 may be YAG, and third layer 515 may be the compound ceramic in one embodiment.

In another example, the layers in the protective layer stack 506 may be alternating layers of two different ceramics. For example, first layer 508 and third layer 515 may be YAG, and second layer 510 and fourth layer 518 may be the compound ceramic. Such alternating layers may provide advantages similar to those set forth above in cases where one material used in the alternating layers is amorphous and the other material used in the alternating layers is crystalline or nano-crystalline.

In some embodiments, one of more of the layers in the thin film protective layer stacks 406, 506 are transition layers formed using a heat treatment. If the body 405, 505 is a ceramic body, then a high temperature heat treatment may be performed to promote interdiffusion between a thin film protective layer and the body. Additionally, the heat treatment may be performed to promote interdiffusion between adjacent thin film protective layers or between a thick protective layer and a thin film protective layer. Notably, the transition layer may be a non-porous layer. The transition layer may act as a diffusion bond between two ceramics, and may provide improved adhesion between the adjacent ceramics. This may help prevent a protective layer from cracking, peeling off, or stripping off during plasma processing.

The thermal treatment may be a heat treatment at up to about 1400-1600 degrees C. for a duration of up to about 24 hours (e.g., 3-6 hours in one embodiment). This may create an interdiffusion layer between a first thin film protective layer and one or more of an adjacent ceramic body, thick protective layer or second thin film protective layer. If the ceramic body is $Al_2O_3$, and the protective layer is composed of a compound ceramic $Y_4Al_2O_9$ (YAM) and a solid solution $Y_{2-x}Zr_xO_3$ ($Y_2O_3$—$ZrO_2$ solid solution), then a $Y_3Al_5O_{12}$ (YAG) interface layer will be formed. Similarly, a heat treatment will cause a transition layer of EAG to form between $Er_2O_3$ and $Al_2O_3$. A heat treatment will also cause a transition layer of YAG to form between $Y_2O_3$ and $Al_2O_3$. A heat treatment may also cause GAG to form between $Gd_2O_3$ and $Al_2O_3$. A heat treatment of yttria stabilized zirconia (YSZ) over $Al_2O_3$ can form a transition layer of the compound ceramic of $Y_4Al_2O_9$ (YAM) and a solid solution $Y_{2-x}Zr_xO_3$. Other transition layers may be formed between other adjacent ceramics.

Figure 6:
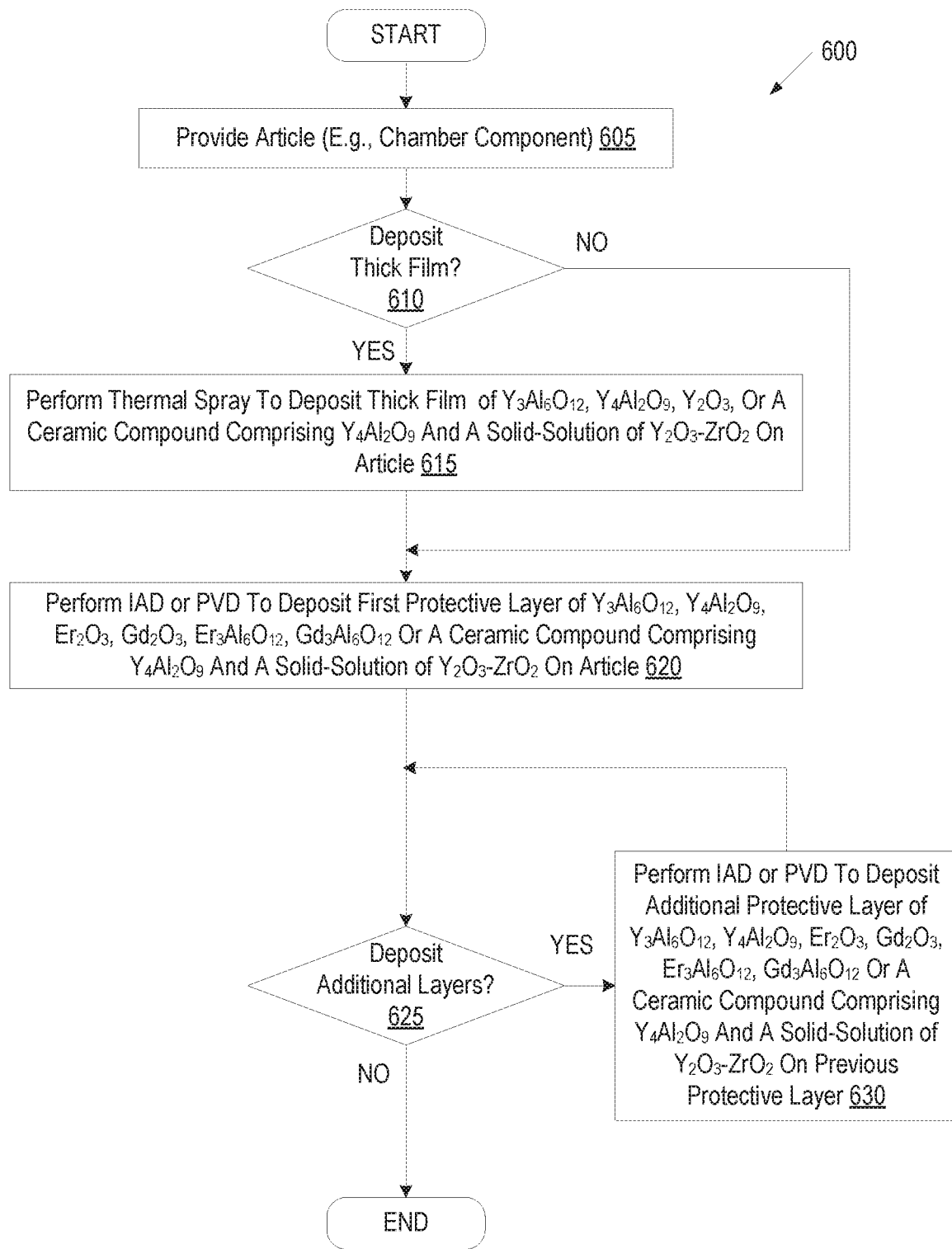
FIG. 6 illustrates one embodiment of a process for forming one or more protective layers over an article.

FIG. 6 illustrates one embodiment of a process 600 for forming a thin film protective layer over a body of an article such as a chamber component. At block 605 of process 600, an article is provided. At block 610, a determination is made of whether or not to deposit a thick film protective layer onto the article. If a thick film protective layer is to be formed, the method proceeds to block 615. Otherwise, the method continues to block 620.

At block 615, a thermal spray process (e.g., a plasma spray process) is performed to deposit a thick film protective layer onto the article. Prior to performing the thermal spray process, the body of the article may be roughened in some embodiments. The thick film protective layer may be any plasma resistant ceramic. Some examples of thick film protective layers include $Y_3Al_6O_{12}$, $Y_4Al_2O_9$, $Y_2O_3$, YSZ, or the ceramic compound comprising $Y_4Al_2O_9$ and a solid-solution of $Y_2O_3$—$ZrO_2$. After the thick film protective layer is formed, for some applications surface features are formed on a surface of the thick film protective layer. For example, if the article is an ESC, then mesas and He holes may be formed. In an alternative embodiment, a plasma resistant ceramic disc or other ceramic structure may be bonded to the body of the article rather than spraying a thick film protective layer.

At block 620, IAD or PVD is performed to deposit a thin film protective layer on the body of the article. If a thick film protective layer was formed at block 615, then the thin film protective layer may be formed over the thick film protective layer as a top coat. The thin film protective layer may be $Y_3Al_6O_{12}$, $Y_4Al_2O_9$, $Er_2O_3$, $Gd_2O_3$, $Er_3Al_6O_{12}$, $Gd_3Al_6O_{12}$, or the ceramic compound of $Y_4Al_2O_9$ and a solid-solution of $Y_2O_3$—$ZrO_2$. A deposition rate for the thin film protective layer may be about 1-8 Angstroms per second, and may be varied by tuning deposition parameters. The thin film protective layers may be very conforming, may be uniform in thickness, and have a good adhesion to the body/substrate that they are deposited on.

At block 625, a determination is made regarding whether to deposit any additional thin film protective layers. If an additional thin film protective layer is to be deposited, the process continues to block 630. At block 630, another thin film protective layer is formed over the first thin film protective layer. The other thin film protective layer may be composed of a ceramic that is different than a ceramic of the first thin film protective layer. In one embodiment, the other thin film protective layer is one of $Y_3Al_6O_{12}$, $Y_4Al_2O_9$, $Er_2O_3$, $Gd_2O_3$, $Er_3Al_6O_{12}$, $Gd_3Al_6O_{12}$, or the ceramic compound of $Y_4Al_2O_9$ and a solid-solution of $Y_2O_3$—$ZrO_2$. The method then returns to block 625. If at block 625 no additional thin film protective layers are to be applied, the process ends. After any of the thin film protective layers is deposited, surface features may be formed in that thin film protective layer.

Figure 7A:
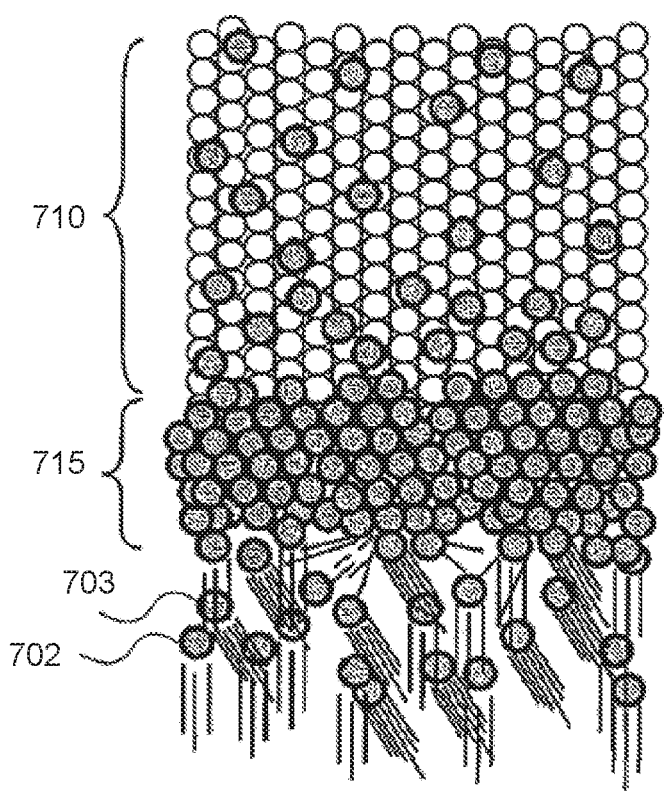
FIG. 7A depicts a deposition mechanism applicable to a variety of deposition techniques utilizing energetic particles such as ion assisted deposition (IAD).

FIG. 7A depicts a deposition mechanism applicable to a variety of deposition techniques utilizing energetic particles such as ion assisted deposition (IAD). Exemplary IAD methods include deposition processes which incorporate ion bombardment, such as evaporation (e.g., activated reactive evaporation (ARE)) and sputtering in the presence of ion bombardment to form plasma resistant coatings as described herein. Any of the IAD methods may be performed in the presence of a reactive gas species, such as $O_2$, $N_2$, halogens, etc.

As shown, the thin film protective layer 715 is formed by an accumulation of deposition materials 702 on an article 710 in the presence of energetic particles 703 such as ions. The deposition materials 702 include atoms, ions, radicals, or their mixture. The energetic particles 703 may impinge and compact the thin film protective layer 715 as it is formed.

Figure 7B:
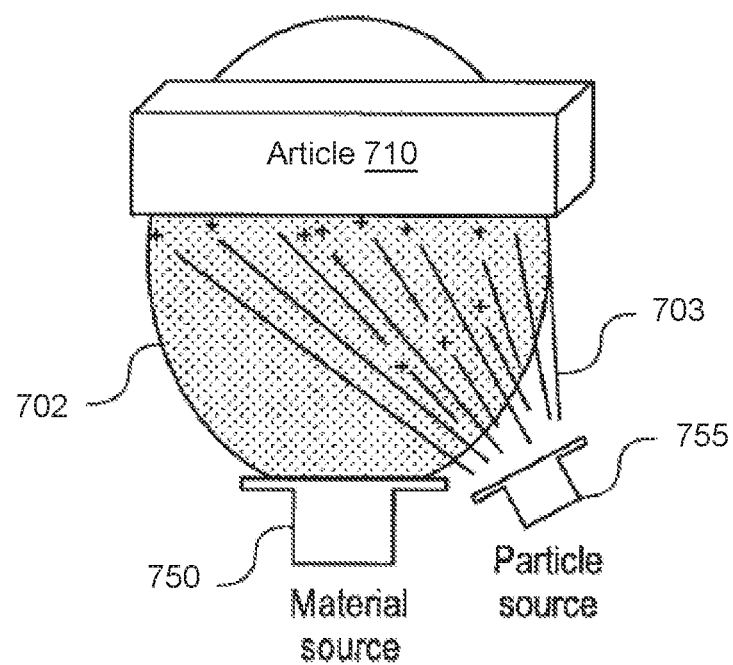
FIG. 7B depicts a schematic of an IAD deposition apparatus.

In one embodiment, IAD is utilized to form the thin film protective layer 715, as previously described elsewhere herein. FIG. 7B depicts a schematic of an IAD deposition apparatus. As shown, a material source 750 provides a flux of deposition materials 702 while an energetic particle source 755 provides a flux of the energetic particles 703, both of which impinge upon the article 710 throughout the IAD process. The energetic particle source 755 may be an Oxygen or other ion source. The energetic particle source 755 may also provide other types of energetic particles such as inert radicals, neutron atoms, and nano-sized particles which come from particle generation sources (e.g., from plasma, reactive gases or from the material source that provide the deposition materials). The material source (e.g., a target body) 750 used to provide the deposition materials 702 may be a bulk sintered ceramic corresponding to the same ceramic that the thin film protective layer 715 is to be composed of. For example, the material source may be a bulk sintered ceramic compound body, or bulk sintered YAG, $Er_2O_3$, $Gd_2O_3$, $Er_3Al_5O_{12}$, or $Gd_3Al_5O_{12}$. IAD may utilize one or more plasmas or beams to provide the material and energetic ion sources. Reactive species may also be provided during deposition of the plasma resistant coating. In one embodiment, the energetic particles 703 include at least one of non-reactive species (e.g., Ar) or reactive species (e.g., O). In further embodiments, reactive species such as CO and halogens (Cl, F, Br, etc.) may also be introduced during the formation of a plasma resistant coating to further increase the tendency to selectively remove deposited material most weakly bonded to the thin film protective layer 715.

With IAD processes, the energetic particles 703 may be controlled by the energetic ion (or other particle) source 755 independently of other deposition parameters. According to the energy (e.g., velocity), density and incident angle of the energetic ion flux, composition, structure, crystalline orientation and grain size of the thin film protective layer may be manipulated. Additional parameters that may be adjusted are a temperature of the article during deposition as well as the duration of the deposition. The ion energy may be roughly categorized into low energy ion assist and high energy ion assist. The ions are projected with a higher velocity with high energy ion assist than with low energy ion assist. In general superior performance has been shown with high energy ion assist. Substrate (article) temperature during deposition may be roughly divided into low temperature (around 120-150° C. in one embodiment which is typical room temperature) and high temperature (around 270° C. in one embodiment).

TABLE 2

Example Thin Film Protective Layers Formed Using IAD

| Material | Thickness (μm) | Dep. Rate (A/s) | Ion Assist | Temp. (° C.) | XRD | He leak rate (cm³/s) | Hardness (GPa) |
|---|---|---|---|---|---|---|---|
| 1st Compound Ceramic | 5 | 2 | Low | 270 | C | N/A | 4.11 |
| 2nd Compound Ceramic | 6 | 1 for 2 μm 2 for 4 μm | Low | 270 | C + A | 5.0E-6 | |
| 3rd Compound Ceramic | 5 | 1 | Low | 270 | C + A | 6.3E-6 | |
| 4th Compound Ceramic | 5 | 1 for 1 μm 2 for 4 μm | High | 270 | A | 1.2E-9 | 7.825 |
| 5th Compound Ceramic | 5 | 1 for 1 μm 2 for 4 μm | High | 120-150 | A | 1.2E-9 | |
| 1st YAG | 5 | 2.5 | Low | 270 | A | 3.7E-7 | 5.7 |
| 2nd YAG | 5 | 1 for 1 μm 2 for 4 μm | High | 270 | A | 4.4E-10 | 8.5 |
| Compound Ceramic/ YAG | 5 | 2 | Low | 270 | C + A | 3.7E-7 | |
| 1st $Er_2O_3$ | 5 | 2 | Low | 270 | C | 3E-6 | |
| 2nd $Er_2O_3$ | 5 | 1 for 1 μm 2 for 4 μm | High | 270 | C | 5.5E-9 | 5.009 |
| 1st EAG (calcined at 1700° C.) | 7.5 | 1 for 1 μm 2 for next | High | 270 | A | 9.5E-10 | 8.485 |
| 2nd EAG (calcined at 1600° C.) | 7.5 | 1 for 1 μm 2 for next | High | 120-150 | A | 2.5E-9 | 9.057 |

Table 2 shows multiple example thin film protective layers formed using IAD with various deposition parameters. Five different examples are shown for thin film protective layers formed from the ceramic compound of $Y_4Al_2O_9$ and a solid-solution of $Y_2O_3$—$ZrO_2$. A first example compound ceramic thin film protective layer has a thickness of 5 microns, and was formed using IAD with a low energy ion assist, a deposition temperature of 270° C., and a deposition rate of 2 angstroms per seconds (A/s). X-ray diffraction showed that the first example compound ceramic thin film protective layer had a crystalline structure. The first example compound ceramic thin film protective layer also had a hardness of 4.11 GPa and visual inspection showed good conformance to the underlying substrate as well as some vertical cracks and some spikes.

A second example compound ceramic thin film protective layer has a thickness of 6 microns, and was formed using IAD with a low energy ion assist, a deposition temperature of 270° C., and a deposition rate of 1 A/s for the first 2 microns and a deposition rate of 2 A/s for the subsequent 4 microns. X-ray diffraction showed that the second example compound ceramic thin film protective layer had a nano-crystalline structure (in which portions are crystalline and portions are amorphous). When used as a seal, the second example compound ceramic thin film protective layer was able to maintain a vacuum down to 5E-6 cm³/s. Visual inspection of the second example compound ceramic thin film protective layer showed good conformance and fewer vertical cracks than the first example compound ceramic thin film protective layer.

A third example compound ceramic thin film protective layer has a thickness of 5 microns, and was formed using IAD with a low energy ion assist, a deposition temperature of 270° C., and a deposition rate of 1 A/s. X-ray diffraction showed that the third example compound ceramic thin film protective layer had a nano-crystalline structure. When used as a seal, the third example compound ceramic thin film protective layer was able to maintain a vacuum down to 6.3E-6 cm$^3$/s. Visual inspection of the third example compound ceramic thin film protective layer showed good conformance and fewer vertical cracks than the first example compound ceramic thin film protective layer.

A fourth example compound ceramic thin film protective layer has a thickness of 5 microns, and was formed using IAD with a high energy ion assist, a deposition temperature of 270° C., and a deposition rate of 1 A/s for the first micron and 2 A/s for the subsequent 4 microns. X-ray diffraction showed that the third example compound ceramic thin film protective layer had an approximately amorphous structure. When used as a seal, the third example compound ceramic thin film protective layer was able to maintain a vacuum down to 1.2E-9 cm$^3$/s. Visual inspection of the fourth example compound ceramic thin film protective layer showed good conformance, a smooth surface and very few vertical cracks. Additionally, the fourth example compound ceramic thin film protective layer has a hardness of 7.825 GPa.

A fifth example compound thin film protective layer was formed using the same parameters as the fourth example compound thin film protective layer, but with a deposition temperature at room temperature (around 120-150° C.). The fifth example compound thin film protective layer showed similar properties to those of the fourth example compound thin film protective layer.

A first example YAG thin film protective layer has a thickness of 5 microns, and was formed using IAD with a low energy ion assist, a deposition temperature of 270° C., and a deposition rate of 2.5 A/s. X-ray diffraction showed that the first YAG ceramic thin film protective layer had an amorphous structure. The first YAG thin film protective layer also had a hardness of 5.7 GPa and visual inspection showed good conformance, minimal cracking and a smooth surface.

A second example YAG thin film protective layer has a thickness of 5 microns, and was formed using IAD with a high energy ion assist, a deposition temperature of 270° C., and a deposition rate of 1 A/s for a first micron and 2 A/s for the subsequent 4 microns. X-ray diffraction showed that the second YAG thin film protective layer had an amorphous structure. The second YAG thin film protective layer also had a hardness of 8.5 GPa and visual inspection showed good conformance, reduced cracking compared to the first YAG thin film and a smooth surface.

An example thin film protective layer stack with alternating compound ceramic and YAG layers has a thickness of 5 microns, and was formed using IAD with a low energy ion assist, a deposition temperature of 270° C., and a deposition rate of 2 A/s. X-ray diffraction showed that the alternating layers were amorphous (for the YAG layers) and crystalline or nano-crystalline (for the compound ceramic layers). Visual inspection showed reduced vertical cracks for the compound ceramic layers.

A first example Er$_2$O$_3$ thin film protective layer has a thickness of 5 microns, and was formed using IAD with a low energy ion assist, a deposition temperature of 270° C., and a deposition rate of 2 A/s. X-ray diffraction showed that the first Er$_2$O$_3$ ceramic thin film protective layer had a crystalline structure. Visual inspection showed good conformance and a vertical cracking.

A second example Er$_2$O$_3$ thin film protective layer has a thickness of 5 microns, and was formed using IAD with a high energy ion assist, a deposition temperature of 270° C., and a deposition rate of 1 A/s for the first micron and a deposition rate of 2 A/s for the subsequent 4 microns. X-ray diffraction showed that the second Er$_2$O$_3$ ceramic thin film protective layer had a crystalline structure. Visual inspection showed good conformance and a less vertical cracking compared to the first Er$_2$O$_3$ ceramic thin film protective layer.

A first example EAG thin film protective layer has a thickness of 7.5 microns, and was formed using IAD with a high energy ion assist, a deposition temperature of 270° C., and a deposition rate of 1 A/s for the first micron and a deposition rate of 2 A/s for the subsequent microns. X-ray diffraction showed that the first EAG ceramic thin film protective layer had an amorphous structure, and the layer had a hardness of 8.485 GPa. Visual inspection showed good conformance and minimal cracking.

A second example EAG thin film protective layer has a thickness of 7.5 microns, and was formed using IAD with a high energy ion assist, a deposition temperature of 120-150° C., and a deposition rate of 1 A/s for the first micron and a deposition rate of 2 A/s for the subsequent microns. X-ray diffraction showed that the second EAG ceramic thin film protective layer had an amorphous structure, and the layer had a hardness of 9.057 GPa. Visual inspection showed good conformance and a less cracking compared to the first EAG ceramic thin film protective layer.

Figure 8:
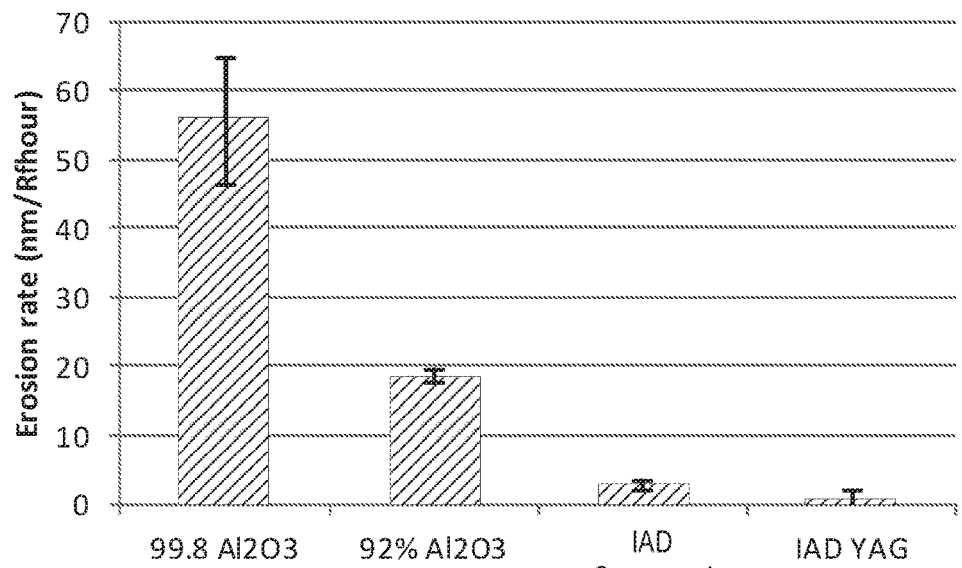
FIGS. 8-9 illustrate erosion rates for thin film protective layers formed in accordance with embodiments of the present invention.
Figure 9:
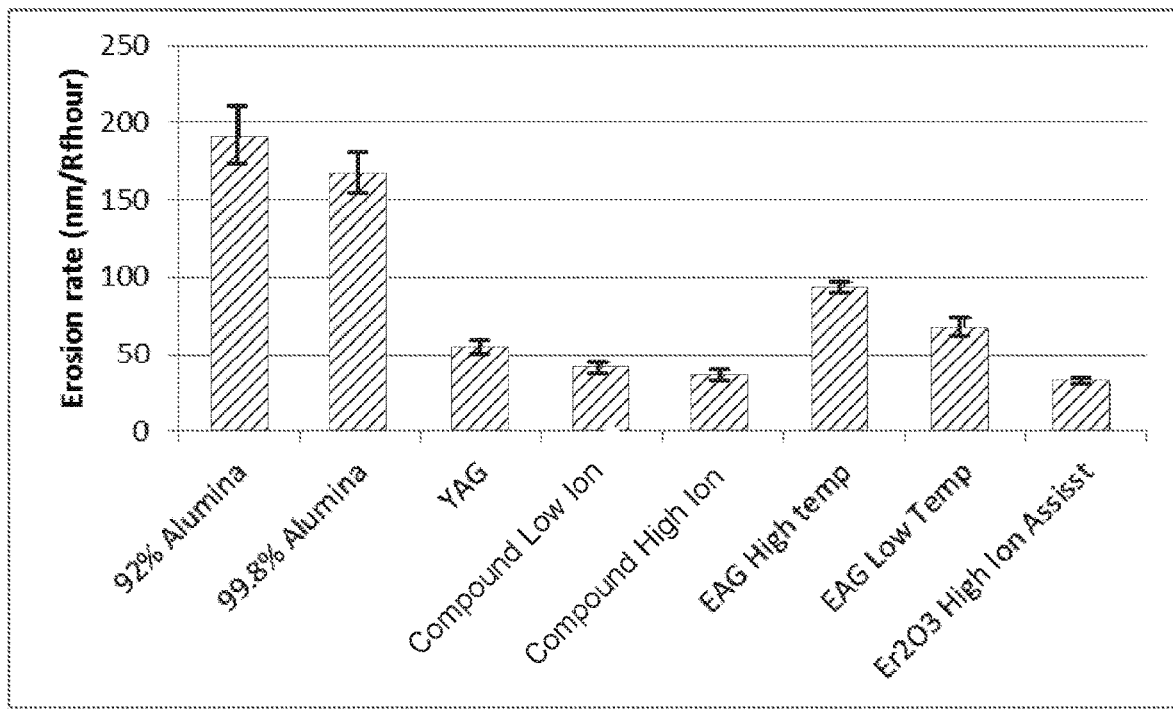

FIGS. 8-9 illustrate erosion rates for thin film protective layers formed in accordance with embodiments of the present invention. FIG. 8 shows erosion rates of thin film protective layers when exposed to a CH$_4$/Cl$_2$ plasma chemistry. As shown, the IAD deposited thin film protective layers show a much improved erosion resistance as compared to Al$_2$O$_3$. For example, alumina with a 92% purity showed an erosion rate of around 18 nanometers pre radiofrequency hour (nm/RFHr) and alumina with a 99.8% purity showed an erosion rate of about 56 nm/RFHr. In contrast an IAD deposited compound ceramic thin film protective layer showed an erosion rate of about 3 nm/RFHr and an IAD deposited YAG thin film protective layer showed an erosion rate of about 1 nm/RFHr.

FIG. 9 shows erosion rates of thin film protective layers when exposed to a H$_2$/NF$_3$ plasma chemistry. As shown, the IAD deposited thin film protective layers show a much improved erosion resistance as compared to Al$_2$O$_3$. For example, alumina with a 92% purity showed an erosion rate of around 190 nm/RFHr and alumina with a 99.8% purity showed an erosion rate of about 165 nm/RFHr. In contrast an IAD deposited YAG thin film protective layer showed an erosion rate of about 52 nm/RFHr. Similarly, a compound ceramic thin film protective layer deposited using IAD with low energy ions showed an erosion rate of about 45 nm/RFHr and a compound ceramic thin film protective layer deposited using IAD with high energy ions showed an erosion rate of about 35 nm/RFHr. An EAG thin film protective layer deposited using IAD with high deposition temperature (e.g., around 270° C.) showed an erosion rate of about 95 nm/RFHr and an EAG thin film protective layer deposited using IAD with low deposition temperature (e.g., around 120-150° C.) showed an erosion rate of about 70 nm/RFHr. An Er$_2$O$_3$ thin film protective layer deposited using IAD with high energy ions showed an erosion rate of about 35 nm/RFHr.

Figure 10:
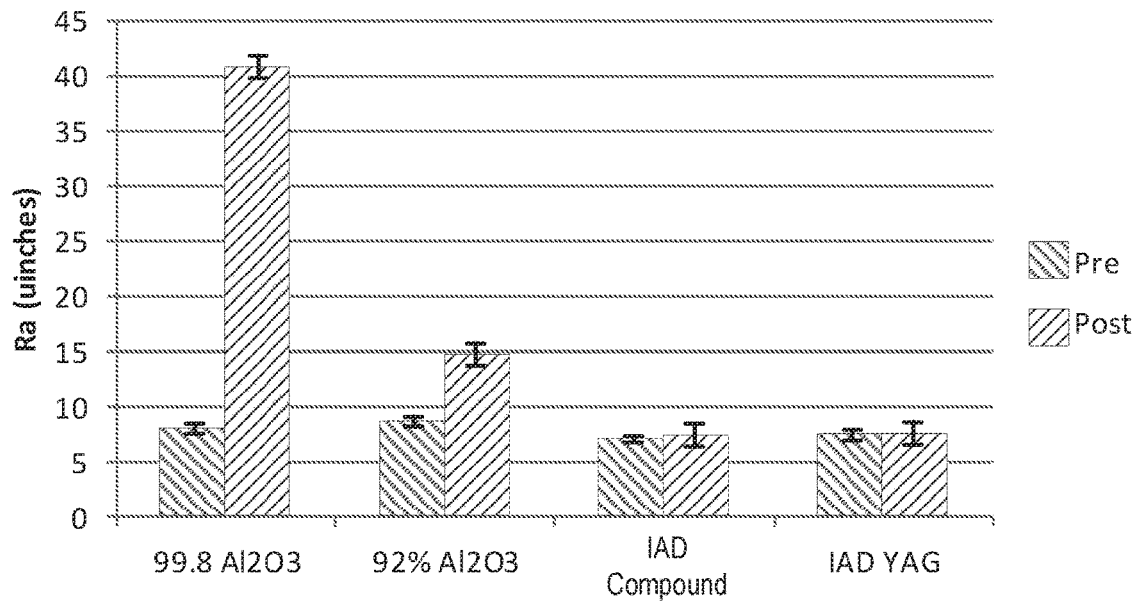
FIGS. 10-11 illustrate roughness profiles for thin film protective layers formed in accordance with embodiments of the present invention.
Figure 11:
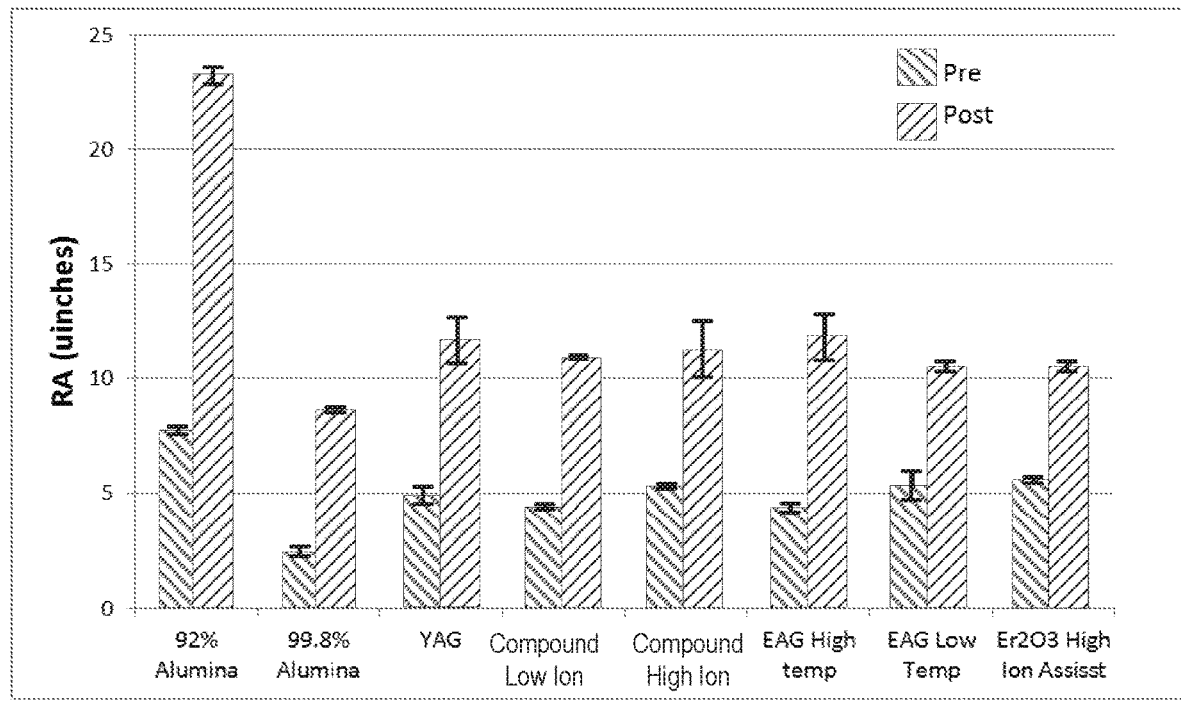

FIGS. 10-11 illustrate roughness profiles for thin film protective layers formed in accordance with embodiments of the present invention. FIG. 10 shows surface roughness profiles of thin film protective layers of FIG. 8 before and after exposure to a $CH_4/Cl_2$ plasma chemistry for 100 RFHrs. As shown, the IAD deposited thin film protective layers show a minimum change in surface roughness after exposure to a $CH_4/Cl_2$ plasma chemistry for 100 RFHrs.

FIG. 11 shows surface roughness profiles of thin film protective layers of FIG. 9 before and after exposure to an $H_2/NF_3$ plasma chemistry for 35 RFHrs. As shown, the IAD deposited thin film protective layers show a minimum change in surface roughness after exposure to an $H_2/NF_3$ plasma chemistry for 35 RFHrs.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An article comprising:
    a ceramic body; and
    a first protective layer on at least one surface of the ceramic body, wherein the first protective layer is a thin film having a thickness of approximately 0.5-20 microns that comprises a first ceramic selected from a group consisting of:
    $Y_3Al_5O_{12}$ having at least two of a volume resistivity of 11.3E16 $\Omega$·cm+/−up to 30%, a dielectric constant of 9.76+/−up to 30%, a thermal conductivity of 20.1 W/m·K+/−up to 30%, a hardness of 8.5 GPa+/−up to 30%, or a hermiticity of 4.4E-10 $cm^3$/s+/−up to 30%,
    $Er_2O_3$ having a hardness of 5 GPa+/−up to 30%,
    $Er_3Al_5O_{12}$ having a hardness of 9 GPa+/−up to 30%, and
    a ceramic compound comprising $Y_4Al_2O_9$ and a solid-solution of $Y_2O_3$—$ZrO_2$, the ceramic compound having at least one of a dielectric constant of 9.83+/−up to 30%, a thermal conductivity of 19.9 W/m·K+/−up to 30%, or a hermiticity of 1.2E-9 $cm^3$/s+/−up to 30%.

2. The article of claim 1, wherein the first protective layer comprises $Er_2O_3$, the first protective layer further having at least one of a dielectric constant of 9.67+/−up to 30%, a thermal conductivity of 19.4 W/m·K+/−up to 30%, or a hermiticity of 5.5E-9 $cm^3$/s+/−up to 30%.

3. The article of claim 1, wherein the first protective layer comprises $Er_3Al_5O_{12}$, the first protective layer further having at least one of a dielectric constant of 9.54+/−up to 30%, a thermal conductivity of 19.2 W/m·K+/−up to 30%, or a hermiticity of 9.5E-10 $cm^3$/s+/−up to 30%.

4. The article of claim 1, wherein:
    the ceramic body comprises a chamber component selected from a group consisting of a chamber lid, a nozzle, a showerhead base, a showerhead gas distribution plate (GDP), a chamber viewport, a process kit ring, a shield, a plasma screen, a flow equalizer, a chamber wall, and a liner kit; and
    the ceramic body comprises at least one of $Al_2O_3$, aluminum nitride, aluminum, anodized aluminum, titanium, stainless steel, quartz, sapphire, silicon, or silicon carbide.

5. The article of claim 1, further comprising:
    a second protective layer on at least a portion of the first protective layer, wherein the second protective layer is a thin film that comprises a second ceramic different from the first ceramic, the second ceramic selected from a group consisting of: $Y_3Al_5O_{12}$, $Y_4Al_2O_9$, $Er_2O_3$, $Gd_2O_3$, $Er_3Al_5O_{12}$, $Gd_3Al_5O_{12}$, and the ceramic compound comprising $Y_4Al_2O_9$ and a solid-solution of $Y_2O_3$—$ZrO_2$.

6. The article of claim 5, wherein:
    the first protective layer has an amorphous structure and comprises $Y_3Al_5O_{12}$ or $Er_3Al_5O_{12}$; and
    the second protective layer has a crystalline or nano-crystalline structure and comprises $Er_2O_3$, $Gd_2O_3$, or the ceramic compound comprising $Y_4Al_2O_9$ and a solid-solution of $Y_2O_3$—$ZrO_2$.

7. The article of claim 5, wherein the ceramic body has a first coefficient of thermal expansion value, the first protective layer has a second coefficient of thermal expansion value, and the second protective layer has a third coefficient of thermal expansion value, wherein the second coefficient of thermal expansion value is between the first coefficient of thermal expansion value and the third coefficient of thermal expansion value.

8. The article of claim 5, further comprising:
    an additional protective layer on the at least one surface of the ceramic body, wherein the additional protective layer is a thick film that comprises a second ceramic selected from a group consisting of $Y_3Al_5O_{12}$, $Y_4Al_2O_9$, $Y_2O_3$, and the ceramic compound comprising $Y_4Al_2O_9$ and a solid-solution of $Y_2O_3$—$ZrO_2$, wherein the first protective layer covers at least a portion of the additional protective layer.

9. The article of claim 1, wherein the first protective layer comprises features formed in the first protective layer by masking the ceramic body and performing at least one of thin-film deposition or etching of specific areas that are not masked after forming the first protective layer.

10. The article of claim 1, wherein a first roughness of the first protective layer is approximately the same as a second roughness of the ceramic body.

11. The article of claim 1, wherein the first ceramic is the $Y_3Al_5O_{12}$, and wherein the $Y_3Al_5O_{12}$ has an amorphous structure and an erosion rate of about 1 nm/hr+/−up to 30% when exposed to a $CH_4/Cl_2$ plasma chemistry.

12. The article of claim 1, wherein the first ceramic is the $Er_3Al_5O_{12}$, and wherein the $Er_3Al_5O_{12}$ has an amorphous structure and an erosion rate of about 70 nm/hr+/−up to 30% when exposed to a $H_2/NF_3$ plasma chemistry.

13. The article of claim 1, wherein the first ceramic is the ceramic compound comprising the $Y_4Al_2O_9$ and the solid-solution of $Y_2O_3$—$ZrO_2$, and wherein the ceramic compound comprising the $Y_4Al_2O_9$ and the solid-solution of $Y_2O_3$—$ZrO_2$ further has an amorphous structure and an erosion rate of about 3 nm/hr+/−up to 30% when exposed to a $CH_4/Cl_2$ plasma chemistry.

14. The article of claim 1, wherein the first ceramic is $Y_3Al_5O_{12}$, and wherein the first ceramic has a hardness of 8.5 GPa+/−up to 30%, a dielectric constant of 9.76+/−up to 30%, a volume resistivity of 11.3E16 Ω·cm+/−up to 30%, and a thermal conductivity of 20.1 W/m·K+/−up to 30%.

15. The article of claim 1, wherein the first ceramic is the $Er_2O_3$, and wherein the first ceramic has a hardness of 5 GPa+/−up to 30%, a dielectric constant of 9.67+/−up to 30%, and a thermal conductivity of 19.4 W/m·K+/−up to 30%.

16. The article of claim 1, wherein the first ceramic is the $Er_3Al_5O_{12}$, and wherein the first ceramic has a hardness of 9 GPa+/−up to 30%, a dielectric constant of 9.54+/−up to 30%, and a thermal conductivity of 19.2 W/m·K+/−up to 30%.

17. The article of claim 1, wherein the first ceramic is the ceramic compound comprising $Y_4Al_2O_9$ and a solid-solution of $Y_2O_3$—$ZrO_2$, and wherein the first ceramic has a hardness of 7.8 GPa+/−up to 30%, a dielectric constant of 9.83+/−up to 30%, a volume resistivity of 4.1E16 Ω·cm+/−up to 30%, and a thermal conductivity of 19.9 W/m·K+/−up to 30%.

18. An article comprising:
a ceramic body; and
a first protective layer on at least one surface of the ceramic body, wherein the first protective layer is a thin film that comprises a first ceramic selected from a group consisting of:
$Y_3Al_5O_{12}$ having at least two of a volume resistivity of 11.3E16 Ω·cm+/−up to 30%, a dielectric constant of 9.76+/−up to 30%, a thermal conductivity of 20.1 W/m·K+/−up to 30%, a hardness of 8.5 GPa+/−up to 30%, or a hermiticity of 4.4E-10 $cm^3$/s+/−up to 30%,
$Er_2O_3$ having a hardness of 5 GPa+/−up to 30%,
$Er_3Al_5O_{12}$ having a hardness of 9 GPa+/−up to 30%, and
a ceramic compound comprising $Y_4Al_2O_9$ and a solid-solution of $Y_2O_3$—$ZrO_2$, the ceramic compound having at least two of a volume resistivity of 4.1E16 Ω·cm+/−up to 30%, a dielectric constant of 9.83+/−up to 30%, a thermal conductivity of 19.9 W/m·K+/−up to 30%, a hardness of 7.8 GPa+/−up to 30%, or a hermiticity of 1.2E-9 $cm^3$/s+/−up to 30%;
wherein the first protective layer comprises a plurality of surface features on a surface of the first protective layer, wherein the plurality of surface features are not in the at least one surface of the ceramic body, and wherein a thickness of the first protective layer at first locations that include the plurality of surface features is greater than a thickness of the first protective layer at second locations that do not include the plurality of surface features.

19. An article comprising:
a ceramic body; and
a first protective layer on at least one surface of the ceramic body, wherein the ceramic body comprises $Al_2O_3$, and wherein the first protective layer is a thin film that comprises a first ceramic selected from a group consisting of:
$Er_2O_3$ having a hardness of 5 GPa+/−up to 30%, and
a ceramic compound comprising $Y_4Al_2O_9$ and a solid-solution of $Y_2O_3$—$ZrO_2$, the ceramic compound having at least two of a volume resistivity of 4.1E16 Ω·cm+/−up to 30%, a dielectric constant of 9.83+/−up to 30%, a thermal conductivity of 19.9 W/m·K+/−up to 30%, a hardness of 7.8 GPa+/−up to 30%, or a hermiticity of 1.2E-9 $cm^3$/s+/−up to 30%; and
a transition layer between the at least one surface of the ceramic body and the first protective layer, wherein the transition layer provides a diffusion bond between the first protective layer and the at least one surface of the ceramic body, and wherein:
the transition layer is $Y_3Al_5O_{12}$ if the first protective layer is the ceramic compound comprising $Y_4Al_2O_9$ and a solid-solution of $Y_2O_3$—$ZrO_2$, and the transition layer is $Er_3Al_5O_{12}$ if the first protective layer is the $Er_2O_3$.

20. The article of claim 19, wherein:
the first protective layer is the $Er_2O_3$ and the transition layer is $Er_3Al_5O_{12}$.

* * * * *